US010388465B2

(12) United States Patent
Gotanda et al.

(10) Patent No.: US 10,388,465 B2
(45) Date of Patent: Aug. 20, 2019

(54) SEMICONDUCTOR ELEMENTS AND METHOD FOR MANUFACTURING THE SAME

(71) Applicant: KABUSHIKI KAISHA TOSHIBA, Minato-ku (JP)

(72) Inventors: Takeshi Gotanda, Yokohama (JP); Haruhi Oooka, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/692,855

(22) Filed: Aug. 31, 2017

(65) Prior Publication Data
US 2018/0261396 A1   Sep. 13, 2018

(30) Foreign Application Priority Data

Mar. 7, 2017   (JP) .................................. 2017-042636

(51) Int. Cl.
*H01G 9/00* (2006.01)
*H01L 51/00* (2006.01)
(Continued)

(52) U.S. Cl.
CPC ......... *H01G 9/2018* (2013.01); *H01G 9/0029* (2013.01); *H01L 51/004* (2013.01);
(Continued)

(58) Field of Classification Search
CPC ........................ H01G 9/2018; H01L 51/0007
(Continued)

(56) References Cited

U.S. PATENT DOCUMENTS 5,545,294 A * 8/1996 Linden ..................... D21F 1/02
                                                          162/336
6,093,242 A * 7/2000 McKee ................... C30B 23/02
                                                          117/2
(Continued)

FOREIGN PATENT DOCUMENTS

JP   2004-207401 A   7/2004
JP   2007-59457 A    3/2007
(Continued)

OTHER PUBLICATIONS

Nam Joong Jeon, et al. "Solvent engineering for high-performance inorganic-organic hybrid perovskite solar cells", nature materials, 13, 2014, 7 pages.
(Continued)

*Primary Examiner* — Igwe U Anya
(74) *Attorney, Agent, or Firm* — Oblon, McClelland, Maier & Neustadt, L.L.P.

(57) ABSTRACT

The present embodiments provide a highly durable semiconductor element capable of generating electricity or emitting light with high efficiency, and further provide a manufacturing method thereof. The semiconductor element according to the embodiment comprises a first electrode, a second electrode, an active layer and a substrate, and is characterized in that the active layer contains crystals oriented anisotropically. For manufacturing the element, the active layer is produced by the steps of: applying a coating solution containing precursor compounds of the active layer and an organic solvent capable of dissolving the precursor compounds, to form a coating film; and then growing the crystals in a specific direction parallel to the surface of the coating film.

20 Claims, 19 Drawing Sheets

(51) Int. Cl.
*H01G 9/20* (2006.01)
*H01L 51/44* (2006.01)
*H01L 51/42* (2006.01)
*H01L 51/50* (2006.01)
*H01L 51/52* (2006.01)

(52) U.S. Cl.
CPC ........ *H01L 51/0007* (2013.01); *H01L 51/009* (2013.01); *H01L 51/0037* (2013.01); *H01L 51/0047* (2013.01); *H01L 51/0072* (2013.01); *H01L 51/4253* (2013.01); *H01L 51/442* (2013.01); *H01L 51/5032* (2013.01); *H01L 51/5203* (2013.01); *Y02E 10/549* (2013.01)

(58) Field of Classification Search
USPC .......................................................... 257/40
See application file for complete search history.

(56) References Cited

U.S. PATENT DOCUMENTS

| | | | |
|---|---|---|---|
| 6,197,600 B1* | 3/2001 | Kijima | C23C 16/40 257/E21.01 |
| 6,559,469 B1* | 5/2003 | Paz de Araujo | C23C 16/448 257/15 |
| 9,082,992 B2 | 7/2015 | Guo et al. | |
| 9,252,374 B2 | 2/2016 | Seok et al. | |
| 2002/0197489 A1* | 12/2002 | Lee | C30B 23/02 428/446 |
| 2003/0008179 A1* | 1/2003 | Lee | C30B 23/02 428/697 |
| 2004/0217353 A1* | 11/2004 | Koo | H01L 27/1285 257/72 |
| 2004/0245526 A1* | 12/2004 | Park | G02F 1/13454 257/72 |
| 2009/0056791 A1* | 3/2009 | Pfenninger | H01L 31/055 136/247 |
| 2010/0019243 A1* | 1/2010 | Sun | H01L 27/1296 257/59 |
| 2012/0017976 A1* | 1/2012 | Nechache | H01L 31/032 136/255 |
| 2012/0061658 A1 | 3/2012 | Forrest et al. | |
| 2015/0136232 A1 | 5/2015 | Snaith et al. | |
| 2015/0200377 A1 | 7/2015 | Etgar et al. | |
| 2015/0243444 A1 | 8/2015 | Irwin et al. | |
| 2015/0249170 A1 | 9/2015 | Snaith et al. | |
| 2015/0287852 A1 | 10/2015 | Leung et al. | |
| 2015/0295194 A1 | 10/2015 | Kanatzidis et al. | |
| 2015/0318477 A1 | 11/2015 | Irwin et al. | |
| 2015/0340632 A1 | 11/2015 | Etgar | |
| 2015/0349282 A1 | 12/2015 | Seok et al. | |
| 2015/0380667 A1 | 12/2015 | Koposov et al. | |
| 2016/0005547 A1 | 1/2016 | Seok et al. | |
| 2016/0005987 A1 | 1/2016 | Koposov et al. | |
| 2016/0104843 A1 | 4/2016 | Kobayashi et al. | |
| 2016/0260918 A1 | 9/2016 | Gotanda et al. | |
| 2016/0276612 A1 | 9/2016 | Gotanda | |
| 2016/0285021 A1 | 9/2016 | Yang et al. | |
| 2016/0379762 A1* | 12/2016 | Gotanda | H01L 51/4273 136/256 |
| 2017/0229249 A1* | 8/2017 | Snaith | H01G 9/2009 |
| 2017/0236651 A1* | 8/2017 | Bakr | H01G 9/2009 136/263 |
| 2018/0040840 A1* | 2/2018 | Hayakawa | H01L 51/442 |

FOREIGN PATENT DOCUMENTS

| | | |
|---|---|---|
| JP | 2012-529188 A | 11/2012 |
| JP | 2014-49551 | 3/2014 |
| JP | 2014-49596 | 3/2014 |
| JP | 2014-49631 | 3/2014 |
| JP | 2015-46298 | 3/2015 |
| JP | 2015-138822 | 7/2015 |
| JP | 2015-535390 | 12/2015 |
| JP | 2016-27587 | 2/2016 |
| JP | 2016-51693 | 4/2016 |
| JP | 2016-82006 | 5/2016 |
| JP | 2016-92294 | 5/2016 |
| JP | 2016-92296 | 5/2016 |
| JP | 2016-96277 | 5/2016 |
| JP | 2016-162911 | 9/2016 |
| JP | 2016-178156 | 10/2016 |
| WO | WO 2013/171517 A1 | 11/2013 |
| WO | WO 2014/020499 A1 | 2/2014 |
| WO | WO 2014/045021 A1 | 3/2014 |
| WO | WO 2014/109604 A1 | 7/2014 |
| WO | WO 2014/109610 A1 | 7/2014 |
| WO | WO 2014/180780 A1 | 11/2014 |
| WO | WO 2015/116297 A2 | 8/2015 |
| WO | WO 2015/116297 A3 | 8/2015 |
| WO | WO 2015/160838 A1 | 10/2015 |
| WO | WO 2016/031962 A1 | 3/2016 |
| WO | WO 2016/038825 A1 | 3/2016 |
| WO | WO 2016/072439 A1 | 5/2016 |

OTHER PUBLICATIONS

Fuzhi Huang, et al. "Gas-assisted preparation of lead iodide perovskite films consisting of a monolayer of single crystalline grains for high efficiency planar solar cells", Nano Energy, 10, 2014, 9 pages.

* cited by examiner

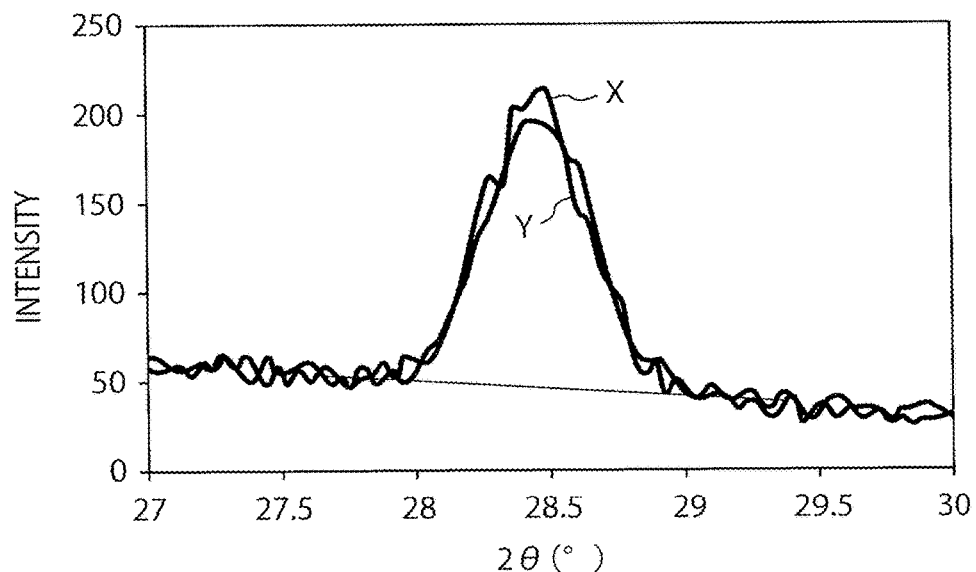
FIG. 10
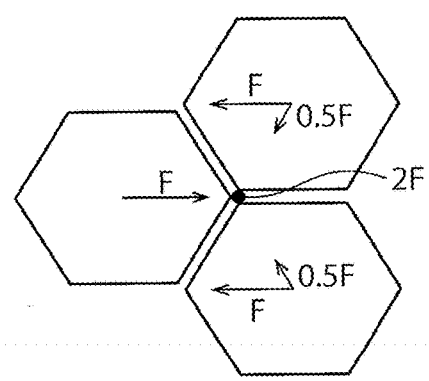 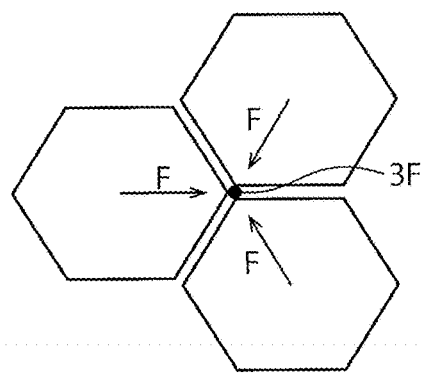
FIG. 11A　　　　FIG. 11B

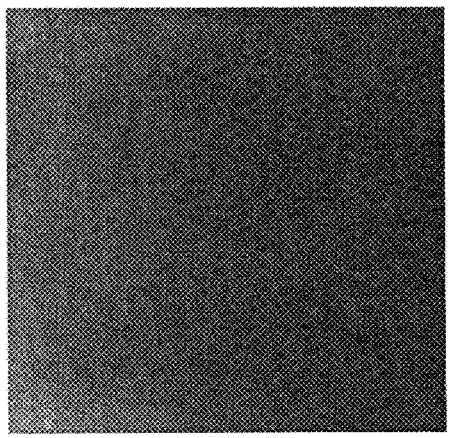
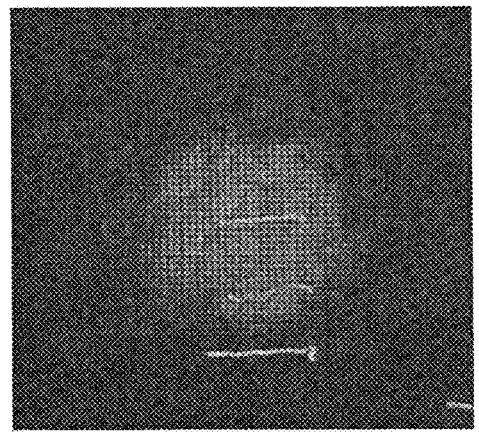
FIG. 12A    FIG. 12B
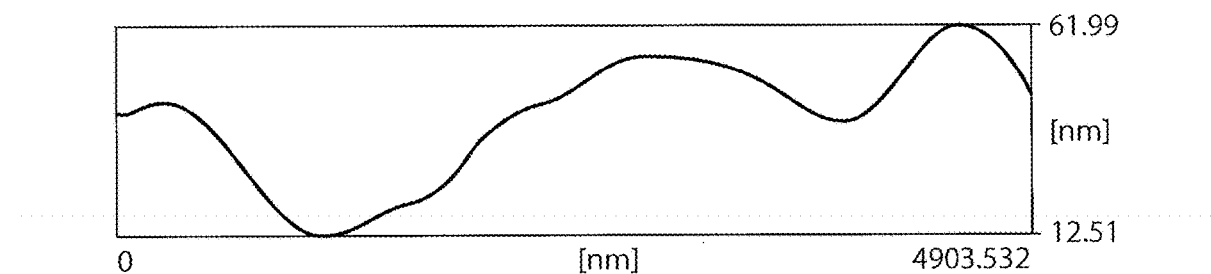
FIG. 13A
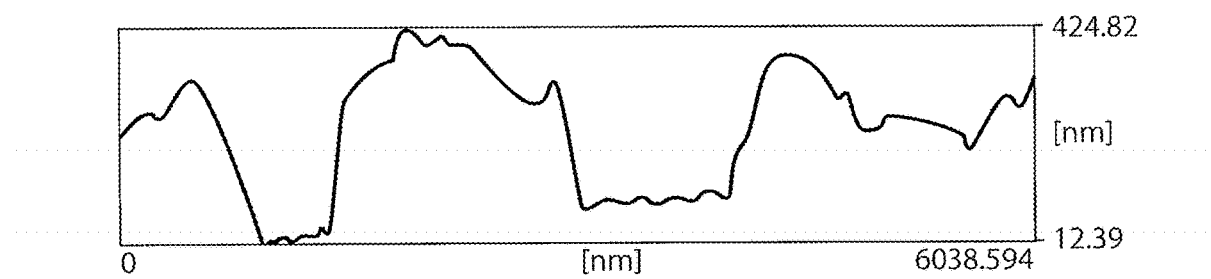
FIG. 13B

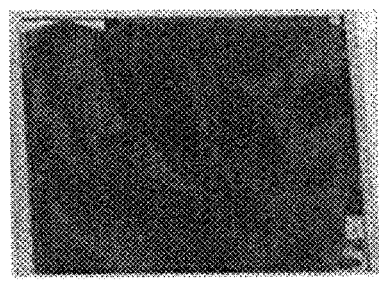
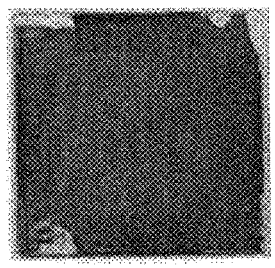
FIG. 16A　　　　FIG. 16B
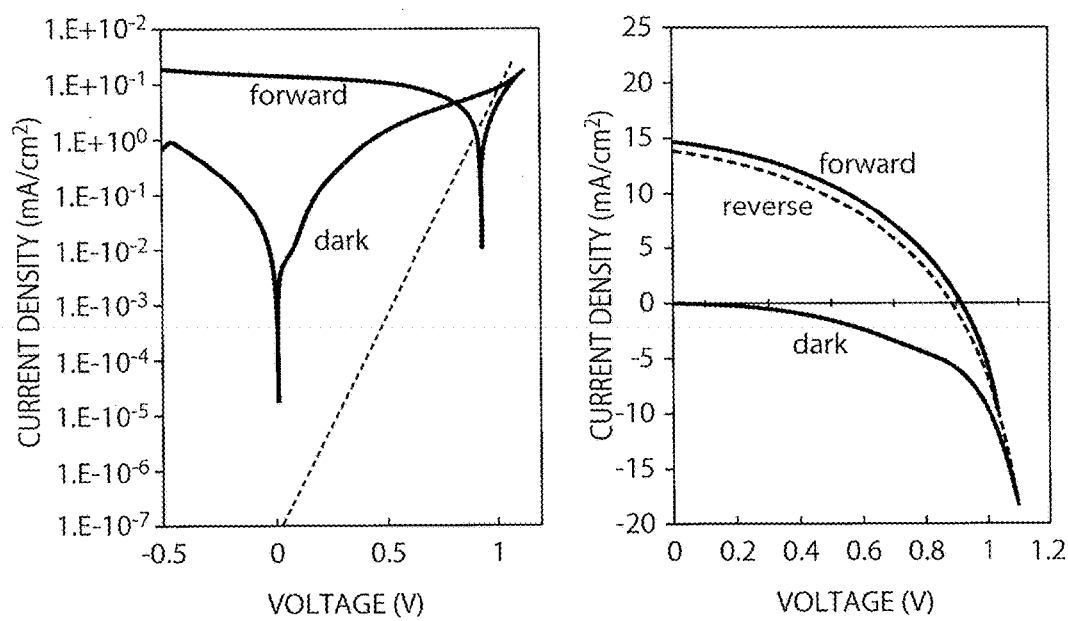
FIG. 17

SEMICONDUCTOR ELEMENTS AND METHOD FOR MANUFACTURING THE SAME

CROSS-REFERENCE TO RELATED APPLICATIONS

This application is based upon and claims the benefit of priority from the prior Japanese Patent Application No. 2017-042636, filed on Mar. 7, 2017, the entire contents of which are incorporated herein by reference.

FIELD

The present disclosure relates to highly efficient and durable large-area semiconductor elements and manufacture thereof.

BACKGROUND

Semiconductor elements, such as photoelectric conversion devices and light-emitting devices, have been hitherto manufactured according to relatively complicated methods, such as, a vapor-deposition process. If it becomes possible to produce the semiconductor elements by coating or printing, they can be obtained more easily and inexpensively than ever before and hence many researches are in progress to develop such methods. Meanwhile, vigorous studies are also under way to develop semiconductor elements, such as, solar cells, sensors and light-emitting devices, made of organic materials or composite materials of organic and inorganic components. Those studies are aimed to develop elements having high efficiency in photoelectric conversion or in luminescence. As a target of those studies, perovskite semiconductor is now gathering attention because it can be produced by a coating process and can be expected to have high efficiency.

BRIEF DESCRIPTION OF THE DRAWINGS

FIG. 1A, FIG. 1B and FIG. 1C are schematic elevational, plane and side sectional views thereof, respectively.

FIG. 10 shows oblique X-ray diffraction profiles of the active layer.

FIGS. 11A and 11B each schematically illustrates internal stress generated among crystallites in the active layer under an anisotropic condition (FIG. 11A) and under an isotropic condition (FIG. 11B).

FIGS. 12A and 12B are photographs showing surface conditions of the perovskite layers in Example 1 and Comparative example 1, respectively.

FIGS. 13A and 13B are section profiles of the perovskite layers in Example 1 and Comparative example 1, respectively.

FIGS. 16A and 16B are photographs showing surface conditions of the perovskite layers not subjected and subjected to immersion, respectively.

FIG. 17 shows I-V characteristics of the element in Example 2 (immersion time: 30 minutes).

DETAILED DESCRIPTION

The semiconductor element according to an embodiment comprises a first electrode, a second electrode, an active layer and a substrate; wherein said active layer contains crystals oriented anisotropically.

Further, the method according to another embodiment for manufacturing a semiconductor element comprising a first electrode, a second electrode, an active layer and a substrate is characterized in that said active layer is produced by the steps of applying a coating solution containing precursor compounds of said active layer and an organic solvent capable of dissolving said precursor compounds, to form a coating film; and then blowing a gas onto said coating film Embodiments will now be explained with reference to the accompanying drawings.

[Semiconductor Element]

In order to explain component members of the semiconductor element manufactured according to the embodiment, those of the element serving as a photoelectric conversion device are exemplified and described below.

Figure 1A:
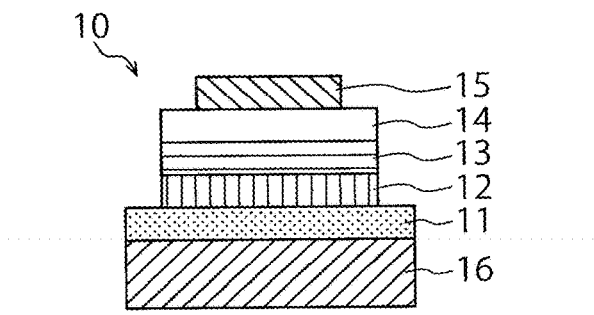
FIGS. 1A, 1B and 1C each schematically shows a structure of the semiconductor element manufactured according to the embodiment.
Figure 1B:
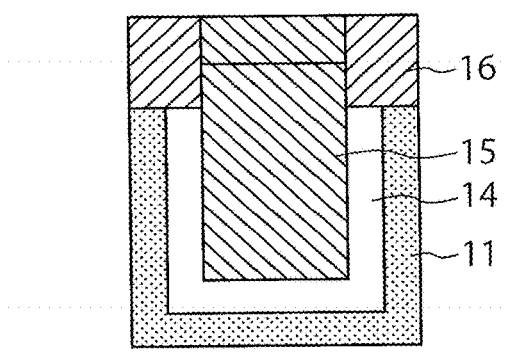
Figure 1C:
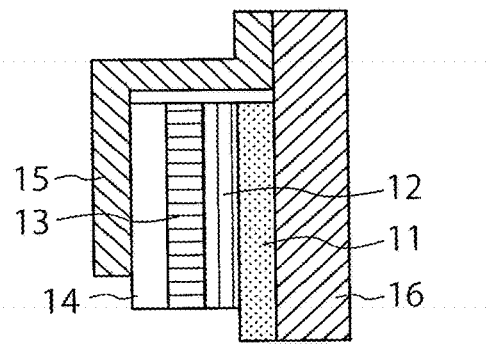

FIGS. 1A to 1C schematically show an example of the structure of a semiconductor element 10, which is a practical form of the semiconductor element according to the embodiment. The element comprises a substrate 16, a first electrode 11, a first buffer layer 12, an active layer 13, a second buffer layer 14, and a second electrode 15, stacked in order. The first or second electrode 11 or 15 serves as an anode or a cathode, and electricity is generated between them by way of an external circuit. Sometimes the active layer serves as a photoelectric conversion layer in which electrons or positive holes are generated to make an electric current between the first and second electrodes 11 and 15 under excitation by light coming through the substrate 16, the first electrode 11 and the first buffer layer 12 or through the second electrode 15 and the second buffer layer 14. At other times, the active layer serves as a light-emitting layer which radiates light when electrons and positive holes are injected therein from the first and second electrodes 11 and 15. Each of the first and second buffer layers 12 and 14 is placed between the active layer and each electrode, and they are not necessarily indispensable in the embodiment. Further, the element may have what is called a back-contact structure, in which both of the first electrode 11 and/or the first buffer layer 12 and the second buffer layer 14 and/or the second electrode 15 are separately placed on the same side of the active layer 13. Furthermore, the active layer may consist of two or more layers in a tandem structure.

In the present disclosure, the "semiconductor element" includes not only a photoelectric conversion device, such as a solar cell or a sensor, but also a light-emitting device. Those devices have the same basic structures although they are different in that the active layer functions as a photoelectric conversion layer or as a light-emitting layer.

(Substrate 16)

The substrate 16 supports other component members. The substrate 16 has a surface on which electrodes can be formed, and accordingly is preferably not impaired by heat applied thereto or by organic solvents brought in contact therewith when the electrodes are formed thereon. Examples of materials of the substrate 16 include: (i) inorganic substances, such as, non-alkali glass and quartz glass; (ii) organic substances, such as, polyethylene, polyethylene terephthalate (PET), polyethylene naphthalate (PEN), polyimide, polyamide, polyamide-imide, liquid crystal polymer, plastics (e.g., cycloolefin polymers), and polymer films; and (iii) metals, such as, stainless steel (SUS), aluminum, titanium and silicon. The substrate 16 may be provided with another photoelectric conversion layer to have a tandem structure.

The substrate 16 may be either transparent or not, and is properly selected according to the structure of the aimed photoelectric conversion device. If the device is so designed that incident light may come from the outer surface of the substrate 16, the substrate is selected to be transparent. However, if the electrode on the opposite side to the substrate 16 is transparent or semitransparent, the substrate does not need to be transparent.

There are no particular restrictions on the thickness of the substrate as long as it has enough strength to support other component members.

If the substrate 16 is placed on the light-incident side, it is possible to provide an antireflection film of, for example, moth-eye structure on the light-incident surface. That structure enables incident light to enter the device efficiently and thereby can improve the energy conversion efficiency of the cell. The moth-eye structure has a surface on which convexes of about 100 nm height are regularly arranged. Because of this convex structure, the refractive index continuously changes along the thickness direction. Accordingly, if the substrate is coated with that antireflective film, the film prevents the refractive index from discontinuous changing. As a result, the film reduces reflection of the incident light and thereby improves the conversion efficiency of the cell.

(First and Second Electrodes)

The first and second electrodes 11 and 15 can be made of materials freely selected from known ones as long as they have electroconductivity. However, the material of the electrode on the light-incident side should be selected from transparent or semitransparent electroconductive substances. Examples of the transparent or semitransparent electrode materials include electroconductive metal oxide films and semitransparent metal films. Either or both of the first and second electrodes 11 and 15 may have a layered structure of composite materials.

Concrete examples of the films include: electroconductive glass films (e.g., NESA) comprising, for example, indium oxide, zinc oxide, tin oxide or a composite thereof, such as, indium-tin oxide (ITO), fluorine-doped tin oxide (FTO), or indium-zinc oxide; and films of metals, such as, gold, platinum, silver, and copper. Among them. ITO and FTO films are particularly preferred.

The electrode made of ITO preferably has a thickness of 30 to 300 nm. If the thickness is thinner than 30 nm, the electroconductivity tends to decrease and hence the resistance tends to increase. The increased resistance often lowers the photoelectric conversion efficiency. On the other hand, however, if the thickness is thicker than 300 nm, the ITO film tends to be less flexible. As a result, the thick film often suffers from cracks when stress is applied. The electrode preferably has as small a sheet resistance as possible. Specifically, the sheet resistance is preferably 10 Ω/square or less. The electrode may be a single layer, but it may consist of stacked plural layers made of materials having different work functions.

If formed adjacently to an electron transport layer, the electrode is preferably made of materials having low work functions, such as, alkali metals and alkaline earth metals. Examples thereof include: Li, In, Al, Ca, Mg, Sm, Tb, Yb, Zr, Na, K, Rb, Cs, Ba, and alloys thereof. Further, metals selected from the above materials having low work functions may be alloyed to use with metals selected from those having relatively high work functions, such as, gold, silver, platinum, copper, manganese, titanium, cobalt, nickel, tungsten, and tin. Examples of the alloys usable for the electrode include: lithium-aluminum alloy, lithium-manganese alloy, lithium-indium alloy, manganese-silver alloy, calcium-indium alloy, manganese-aluminum alloy, indium-silver alloy, and calcium-aluminum alloy. The electrode made of those alloys preferably has a thickness of 1 to 500 nm, more preferably 10 to 300 nm. If the thickness is thinner than the above, the resistance often increases too much to transfer a sufficient amount of generated electric charges into the external circuit. On the other hand, if the electrode is too thick, it takes a long time to form the electrode. Accordingly, the electrode material is often exposed to high temperature in such a long time that it may be damaged to deteriorate the performance. In addition, the material is used in a large amount and the film-forming apparatus is operated for a long time, and consequently the production cost tends to increase.

It is also possible to adopt organic materials as the electrode materials. For example, electroconductive polymer compounds, such as polyethylenedioxythiophene (hereinafter, often referred to as "PEDOT"), are preferably employed. Those electroconductive polymer compounds are commercially available, and examples thereof include Clevios PH500, Clevios PH, Clevios P VP Al 4083, and Clevios HIL 1,1 ([trademark], manufactured by H.C, Starck GmbH). PEDOT has a work function (or ionization potential) of 4.4 eV, but can be combined with other materials to control the work function of the electrode. For example, PEDOT is mixed with polyethylene sulfonate salt (hereinafter, often referred to as "PSS") to control the work function in a range of 5.0 to 5.8 eV. However, if electroconductive polymer compounds and other materials are combined to form a layer, the layer may contain the electroconductive polymer compounds in such a relatively small content that it may deteriorate in carrier transportability. In view of that, the electrode thus formed preferably has a thickness of 50 nm or less, more preferably 15 nm or less. Further, if the content of the electroconductive polymer compounds is relatively decreased, the electrode tends to repel the coating solution applied thereon to form the perovskite layer because the surface energy changes. Consequently, the resultant perovskite layer may suffer from pinholes formed thereon. In order to avoid them, nitrogen gas or the like is preferably blown onto the coating solution so that the solvent may be completely dried before the solution is repelled. As the electroconductive polymer compounds, polypyrrole, polythiophene and polyaniline are preferably employed.

(Photoelectric Conversion Layer)

The photoelectric conversion layer (active layer) 13 in the semiconductor element according to the embodiment can be freely selected from known active layers. The active layer in the embodiment contains crystals, and typically they at least partly have a perovskite structure. Here, the "perovskite structure" means a kind of crystal structure and, specifically, the same crystal structure as perovskite. The perovskite structure typically comprises ions A, B and X where the ion B is smaller than the ion A. The chemical composition of this crystal structure can be represented, for example, by the following formula (1): $ABX_3$ (1).

In the formula, A is typically a primary ammonium ion, such as, $CH_3NH_3^+$, $C_2H_5NH_3^+$, $C_3H_7NH_3^+$, $C_4H_9NH_3^+$ or $HC(NH_2)_2^+$, and is preferably $CH_3NH_3^+$. However. A is not limited to them. Further, A is also preferably Rb, Cs or 1,1,1-trifluoroethyl ammonium iodide (FEAI), but is not limited to them. The ion B is typically a divalent metal ion, and is preferably $Pb^{2+}$ or $Sn^{2+}$. However, B is not limited to them and ions other than divalent ions can be mixed to use. The ion X is a halogen ion, which is, for example, selected from $F^-$, $Cl^-$, $Br^-$, $I^-$ or $At^-$, and is preferably $Cl^-$, $Br^-$ or $I^-$. However. X is not limited to them. The materials of A, B and X may be individually single substances or mixtures. Even if not strictly satisfying the ratio of $ABX_3$, those ions can fill the roles.

This crystal structure has a unit lattice of, for example, cubic crystal, tetragonal crystal or orthorhombic crystal, and the ions A and B are positioned at vertexes and body centers, respectively. In a cubic lattice in which the ion B is centered, the ion X is positioned at each face center. In this crystal structure, the unit lattice includes an octahedron consisting of one B ion and six X ions. This octahedron interacts with the ions A, and thereby is readily distorted to undergo phase transition into a symmetrical crystal. This phase transition drastically changes the crystal properties, so that electrons or holes are released out of the crystal. In this way, electricity is presumed to be generated.

In the photoelectric conversion device according to the embodiment, the active layer has anisotropy. This means that the active layer contains crystals, such as perovskite crystals, whose crystal faces are oriented similarly. If the active layer is made of a single perovskite crystal, the crystal face thereof is oriented in a specific direction. However, it is generally difficult to form an active layer made of a single crystal. Normally, the active layer has a polycrystalline structure and the crystal faces thereof are randomly oriented unless the crystal growth is controlled.

Figure 2A:
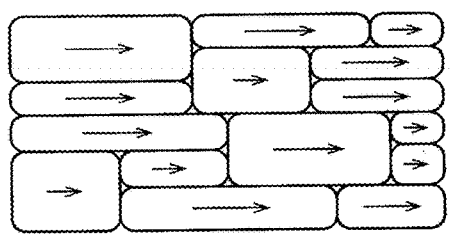
FIG. 2A is a conceptual illustration of an active layer contained in a photoelectric conversion element according to the embodiment.
Figure 2B:
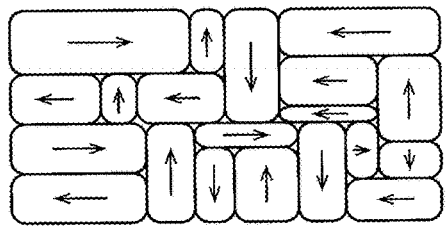
FIG. 2B is a conceptual illustration of a common active layer.

The crystals in the embodiment are controlled to be arranged so that the faces thereof are oriented similarly. FIGS. 2A and 2B each shows conceptual illustrations of an active layer contained in a photoelectric conversion layer according to the embodiment (FIG. 2A) and of a common active layer (FIG. 2B). The arrows in the illustrations indicate directions of the crystal faces.

FIG. 2A is a conceptual illustration, and hence actually there is deviation in the directions of the crystals even in the active layer according to the embodiment. Even so, the smaller the deviation is, the more durable the active layer tends to be. Since FIG. 2B is also a conceptual illustration, the crystals in a common active layer are not always oriented perpendicularly to each other and are oriented at random.

Whether the active layer has anisotropy or not can be judged by measuring oblique X-ray diffraction at one point of the active layer surface. Specifically, if the crystals are oriented similarly as shown in FIG. 2A, the X-ray diffraction intensities are different between in the orientation direction and in the direction perpendicular thereto. This means that the X-ray diffraction intensity in a first direction is different from that in a second direction perpendicular to the first direction. The difference is the maximum when the first direction is parallel to the orientation direction. On the other hand, if the crystals are oriented randomly as shown in FIG. 2B, the X-ray diffraction intensities are the same in all directions. The measurement can be carried out by means of, for example, an X-ray diffraction system (SmartLab [trademark], manufactured by Rigaku Corporation) under the following measurement conditions:

X-ray source: CuKα line (parallel optical system, divergence angle: about 0.04°)/45 kV, 200 mA;

slit system (light-incident side): Soller 0.5° to 0.1 mm (w)×5 mm (h);

slit system (light-receiving side): 20 mm (w)×20 mm (h) to Soller 0.5° to 20 mm (w)×20 mm (h);

incident angle: 0.24° stepping rate: 0.5°/minute.

The area exposed to X-ray depends on the incident angle ω, and is 1 mm² to 4 cm². The crystal orientation is preferably confirmed in a large area, but the effect of the embodiment can be obtained even if the orientation is observed only in an area of 1 mm².

The X-ray diffraction intensities can be easily compared by comparing the peak intensities in X-ray diffraction profiles. There are plural peaks attributed to the perovskite crystal, but it is preferred to evaluate a peak of (2θ=28.4±0.2°), which corresponds to the (220) face. Specifically, the diffraction intensity at the peak position corresponding to the (220) face is measured while the active layer surface is being turned. The diffraction intensity reaches the maximum in the orientation direction of the crystals. When the active layer is further turned, the intensity decreases. The diffraction intensity generally reaches the minimum in a direction perpendicular to the direction giving the maximum intensity. If there is a specific difference between the maximum and minimum diffraction intensities thus measured, the active layer is regarded to have anisotropy.

It is also possible to evaluate the intensities at a peak corresponding to a crystal face other than the (220) face. Examples of that peak include the peaks corresponding to the (200) face (2θ=29.25±1.75°), (110) face (2θ=14.08±0.2°), (310) face (2θ=31.84±0.2°), and (224) face (2θ=40.7±0.2°). The peak corresponding to the (200) face, which is located near that corresponding to the (220) face, is known to shift according to the ion species forming the perovskite structure and accordingly is observed in a range wider than the other peaks. However, those peaks often have weak intensities or are often interfered by other peaks, and hence it may be difficult to evaluate the intensities at those peaks. It is therefore particularly preferred to evaluate the intensities at the peak corresponding to the (220) face.

It is presumed that, the larger the difference is between the maximum and minimum diffraction intensities, the more uniformly the crystals are oriented. Accordingly, the maximum intensity is preferably not less than 1.05 times, further preferably not less than 1.1 times larger than the minimum intensity. Here, it should be noted that the X-ray diffraction measurement is often affected by noises. Accordingly, the above ratio should be evaluated in consideration of the noises. Further, it should be also noted that the noises are preferably evaluated within a range of 1° from the intersection point between the baseline and the tail of each peak. That is because the noises have angular dependence.

If the active layer is large, the orientation direction of the crystals at one point may be different from that at another point. In the embodiment, if the crystals in 80% or more of the whole active layer are oriented in the same direction, the active layer is regarded to have anisotropy.

If the photoelectric conversion layer is thickened, the amount of absorbed light increases and accordingly the short circuit current density (Jsc) is enhanced. On the other hand, however, the carrier transport distance also extends and accordingly loss due to deactivation tends to increase. For the purpose of obtaining the maximum efficiency, the thickness is preferably 30 to 1000 nm, more preferably 60 to 600 nm.

Actually, for example, the device according to the embodiment and other common devices can be made to have the same conversion efficiencies under sunlight exposure conditions by individually controlling the thicknesses of their photoelectric conversion layers. However, under the conditions of as low illuminance as 200 lux, the device of the embodiment can realize a higher efficiency than common devices because having the conversion layer different from them in properties.

(First and Second Buffer Layers 12 and 14)

According to necessity, the photoelectric conversion device of the embodiment comprises first and second buffer layers 12 and 14. The first or second buffer layer 12 or 14 is placed between the photoelectric conversion layer and the first or second electrode, respectively. If they are provided, one of them serves as a hole transport layer while the other serves as an electron transport layer. Those layers are preferably formed so that the device can achieve high conversion efficiency, but are not necessarily indispensable. Either or both of them may be omitted. Further, either or both of the first and second buffer layers 12 and 14 may have a layered structure of composite materials. They can be made of organic materials or metal oxides.

Preferred examples of the metal oxides include: titanium oxide, molybdenum oxide, vanadium oxide, zinc oxide, nickel oxide, lithium oxide, calcium oxide, cesium oxide, aluminum oxide, niobium oxide and copper oxide. Among them, titanium oxide is preferred. Specifically, it is particularly preferred to adopt amorphous titanium oxide obtained by hydrolysis of titanium alkoxide according to sol-gel method The electron transport layer has a function of transporting electrons efficiently. If serving as the electron transport layer, the buffer layer preferably contains a halogen compound or a metal oxide. Preferred examples of the halogen compound include LiF, LiCl, LiBr, LiI, NaF, NaCl, NaBr, NaI, KF, KCl, KBr, KI and CsF. Among them. LiF is particularly preferred.

Further, the electron transport layer can comprise inorganic materials such as metal calcium.

If formed in the photoelectric conversion device of the embodiment, the electron transport layer preferably has a thickness of 20 nm or less. This is because that thickness lowers the film resistance of the electron transport layer to enhance the conversion efficiency. On the other hand, the thickness can be 5 nm or more. The electron transport layer thicker than a particular thickness can show hole-blocking effect fully enough to prevent generated excitons from deactivating before releasing electrons and holes. As a result of the effect, electric currents can be efficiently extracted.

As the n-type organic semiconductor, fullerenes and derivatives thereof are preferably adopted but not limited thereto. The derivatives have, for example, basic skeletons of $C_{60}$, $C_{70}$, $C_{76}$, $C_{78}$ and $C_{84}$. In those fullerene derivatives, carbon atoms in the fullerene skeletons may be modified with desired functional groups, which may combine with each other to form rings. The fullerene derivatives include fullerene polymers. The fullerene derivatives preferably contain functional groups having such high affinity to solvents that they can have high solubility therein.

Examples of the functional groups in the fullerene derivatives include: hydrogen; hydroxyl; halogen atoms, such as, fluorine and chlorine; alkyl groups, such as, methyl and ethyl; alkenyl groups, such as, vinyl; cyano; alkoxy groups, such as, methoxy and ethoxy; aromatic hydrocarbon groups, such as, phenyl and naphthyl; and aromatic heterocyclic groups, such as, thienyl and pyridyl. Concrete examples of the n-type organic semiconductor include: hydrogenated fullerenes of $C_{60}H_{36}$ and $C_{70}H_{36}$, oxide fullerenes of $C_{60}$ and $C_{70}$, and fullerene metal complexes.

Among the above, it is particularly preferred to use [60]PCBM ([6,6]-phenylC$_{61}$butyric methyl ester) or [70] PCBM ([6,6]-phenylC$_{71}$butyric methyl ester) as the fullerene derivative.

Further, as the n-type organic semiconductor, it is also possible to use a low molecular-weight compound capable of forming a film by vapor deposition. Here, the "low molecular-weight compound" means a compound whose number- and weight-average molecular weights (Mn and Mw) are the same and 10,000 or less. It is particularly preferred to adopt BCP (bathocuproine), Bphen (4,7-diphenyl-1,10-phenanthroline), TpPyPB (1,3,5-tri(p-pyridine-3-yl-phenyl) benzene) or DPPS (diphenyl bis(4-pyridine-3-yl) phenyl)silane).

The hole transport layer has a function of transporting holes efficiently. If serving as the hole transport layer, the buffer layer can contain a p-type or n-type organic semiconductor material. Here, the "p-type or n-type organic semiconductor material" means a substance capable of serving as an electron donor or acceptor material when used in formation of a hetero- or bulkhetero-junction.

The p-type organic semiconductor can be employed as a material of the hole transport layer. For example, the p-type organic semiconductor preferably contains a copolymer comprising a donor unit and an acceptor unit. It is possible to use fluorine, thiophene and the like as the donor unit. As the acceptor unit, benzothiadiazole and the like can be used. Examples of the material usable for the hole transport layer include: polythiophene and derivatives thereof, polypyrrole and derivatives thereof, pyrazoline derivatives, arylamine derivatives, stilbene derivatives, triphenyldiamine derivatives, oligothiophene and derivatives thereof, polyvinyl carbazole and derivatives thereof, polysilane and derivatives thereof, polysiloxane derivatives having aromatic amines in their main or side chains, polyaniline and derivatives thereof, phthalocyanine derivatives, porphyrin and derivatives thereof, polyphenylenevinylene and derivatives thereof, polythienylenevinylene and derivatives thereof, benzodithiophene and derivatives thereof, and thieno[3,2-b] thiophene and derivatives thereof. Those materials may be combined to use for the hole transport layer. Further, it is also possible to use copolymers composed of comonomers constituting the above materials. Among the above, polythiophene and derivatives thereof are preferred because they have excellent steric regularity and relatively high solubility in solvents.

Furthermore, the hole transport layer may be formed by use of derivatives of copolymer containing carbazole, benzothiadiazole and thiophene. Examples of those derivatives include poly[N-9'-heptadecanyl-2,7-carbazole-alt-5,5-(4',7'-di-2-thienyl-2',1',3'-benzothiadiazole)] (hereinafter, often referred to as "PCDTBT). In addition, also preferred are copolymers of benzodithiophene (BDT) derivatives and thieno[3,2-b]thiophene derivatives. Preferred examples thereof include: poly[[4,8-bis[(2-ethylhexyl)oxy]benzo[1,2-b:4-5-b']dithiophene-2,6-dyl][3-fluoro-2-[(2-ethylhexyl) carbonyl]thieno[3,4-b]thiophenedyl]] (hereinafter, often referred to as "PTB7"); and PTB7-Th (often referred to as "PCE10" or "PBDTTT-EFT"), which contains thienyl group having weaker electron donatability than the alkoxy group in PTB7. Still further, it is still also possible to adopt metal oxide as the material of the hole transport layer. Preferred examples of the metal oxide include titanium oxide, molybdenum oxide, vanadium oxide, zinc oxide, nickel oxide, lithium oxide, calcium oxide, cesium oxide and aluminum oxide. They have the advantage of being inexpensive. As the material of the hole transport layer, thiocyanates such as copper thiocyanate are also employable.

The above p-type organic semiconductors and other transport layer materials, such as spiro-OMeTAD, can be doped with dopants. Examples of the dopants include: oxygen, 4-tert-butylpyridine, lithium-bis(trifluoromethanesulfonyl) imide (Li-TFSI), acetonitrile, tris[2-(1H-pyrazole-1-yl)pyridine]cobalt (III) tris(hexafluorophosphate) (commercially available under the trade name of "FK102 [trademark]", manufactured by Wako Pure Chemical Industries, Ltd.), and tris[2-(1H-pyrazole-1-yl) pyrimidine]cobalt (III) tris[bis (trisfluoromethylsulfonyl)imide) (MY11).

The hole transport layer can be formed by use of electroconductive polymer compounds, such as, polyethylenedioxythiophene. The electroconductive polymer compounds described above for the electrodes are also employable. Also, as for the hole transport layer, polythiophene-type polymers such as PEDOT can be combined with other compounds to prepare a material having a work function suitable for transporting holes. Specifically, the work function of the hole transport layer is preferably controlled to be lower than the valence band of the aforementioned active layer.

(Undercoat Layer)

It is possible to form an undercoat layer on the electrode in addition to or in place of the first or second buffer layer.

The undercoat layer preferably comprises a low molecular weight compound. Here, the "low molecular weight compound" means a compound whose number- and weight-average molecular weights Mn and Mw are the same and 10,000 or less. Examples thereof include: organic sulfur compounds, organic selenium and tellurium compounds, nitrile compounds, monoalkylsilanes, carboxylic acids, phosphonic acids, phosphoric esters, organic silane compounds, unsaturated hydrocarbons, alcohols, aldehydes, alkyl bromides, diazo compounds, and alkyl iodides. For example, 4-fluorobanzoic acid (FBA) is preferred.

The undercoat layer can be formed by casting and drying a coating solution containing the low molecular weight compound described above. The undercoat layer is effective in that the carrier collection efficiency from the perovskite layer to the electrodes can be improved by the action of vacuum level shift caused by dipoles, in that the perovskite layer can be improved in crystallizability, in that formation of pinholes can be inhibited in the perovskite layer, and in that incident light can be more transmitted through the light-receiving surface. As a result, the current density is increased and the fill factor is improved, and accordingly the photoelectric conversion efficiency and the luminous efficiency are enhanced. Particularly when the perovskite structure is formed on the electrode or on the buffer layer of large lattice mismatch-containing crystal system other than titanium oxide or aluminum oxide, the undercoat layer is provided to function by itself as a stress relaxation layer or to give the stress relaxation function to the perovskite structure in a part near the undercoat layer. Thus, the undercoat layer not only improves crystallizability of the perovskite layer but also relaxes the internal stress generated by crystal growth to inhibit pinholes and to realize excellent interface bonding.

Further, metal oxides can be adopted to form an undercoat layer, which may be a dense film or can have a mesoporous structure. The metal oxides are preferably oxides of various metals. Preferred examples of the metals include titanium, molybdenum, vanadium, zinc, nickel, lithium, calcium, cesium, aluminum, niobium and copper. The undercoat layer can reduce leak currents between the electrodes even if pinholes, cracks and voids are formed in the active layer.

Thus, the structure of the photoelectric conversion device according to the present embodiment is explained in the above description. The aforementioned active layer having a perovskite structure can function also as a light-emitting layer. Accordingly, not only photoelectric conversion devices but also light-emitting devices can be produced according to the below-described method for manufacturing semiconductor elements. In the embodiment, therefore, they are altogether referred to as "semiconductor elements".

[Method for Manufacturing Semiconductor Elements]

The semiconductor element-manufacturing method according to the embodiment is characterized by the procedures for forming an active layer having a perovskite structure. There are no particular restrictions on the materials and formation processes of the substrate, of the first and second electrodes and of the buffer layers optionally formed thereon, and they can be formed in known manners. The method of the embodiment for manufacturing semiconductor elements are explained below.

(Formation of First Electrode)

First, the first electrode is provided on the substrate. The electrode can be formed by any process, which is selected from, for example, vacuum deposition, sputtering, ion-plating, normal plating, wet-coating or the like.

(Formation of First Buffer Layer and Undercoat Layer)

Subsequently, according to necessity, the buffer layer and/or the undercoat layer are formed thereon. In the same manner as that for the first electrode, the buffer layer can be also formed by a process selected from vacuum deposition, sputtering, ion-plating, normal plating, wet-coating or the like.

(Formation of Active Layer)

The active layer is then formed on the electrode directly or via the first buffer layer or the undercoat layer.

In the method of the embodiment, the active layer is formed by a wet-coating process. Specifically, the first electrode, the first buffer layer or the undercoat layer is coated with a coating solution containing precursor compounds for forming the perovskite structure and an organic solvent capable of dissolving the precursor compounds, to form a coating film.

Examples of the solvent include N,N-dimethylformamide (DMF), γ-butyrolactone and dimethyl sulfoxide (DMSO). There are no particular restrictions on the solvent used in the coating solution as long as it can dissolve the materials, and the solvent may be a mixed solvent. The mixed solvent preferably contains DMSO, and the amount of DMSO is particularly preferably in a range of 10 to 20 wt %. That solvent makes it possible to form a perovskite layer having both a smooth surface and high crystallizability. Specifically, from the coating solution containing that solvent, the perovskite layer can be crystallized without forming pinholes. Accordingly, the above solvent tends to realize high conversion efficiency. The coating solution can be prepared by dissolving two or more starting materials for forming the perovskite structure in a solvent. Otherwise, two or more starting materials for forming the perovskite structure may be individually dissolved in solvents, and then the obtained solutions are one-by-one cast by means of coating machine, such as, spin coater, slit coater, bar coater, or dip coater. There are no particular restrictions on the concentration of the precursor compounds, but it is preferably 23 wt % or less in consideration of the conversion efficiency.

The coating solution may contain additives. Preferred examples of the additives include 1,8-diiodooctane (DIO) and N-cyclohexyl-2-pyrrolidone (CHP).

It is generally known that, if the element structure includes a mesoporous structure therein, leak currents between the electrodes are reduced even when pinholes, cracks and/or voids are formed in the active layer. This effect can hardly be obtained if the element structure includes no mesoporous structure therein. However, if the coating solution in the embodiment contains plural materials for the perovskite structure, the active layer less undergoes volume shrinkage in its formation and consequently the obtained layer tends to have a small number of pinholes, cracks and/or voids. In addition, if another solution containing methylammonium iodide (MAI), metal halogen compounds and the like is further cast thereon after the coating solution is applied, reactions with unreacted metal halogen compounds proceed and consequently the obtained layer tends to have a much smaller number of pinholes, cracks and/or voids. It is, therefore, preferred to coat the active layer with the MAI-containing solution after the coating solution is cast thereon. The MAI solution is preferably applied after the gas-blowing procedure described below.

(Gas-Blowing)

In the method of the embodiment, the perovskite crystals are made oriented in the coating film. In order to orient the crystals, the coating film is blown with a gas. The gas-blowing procedure makes it possible to eventually obtain a favorable perovskite layer.

There are no particular restrictions on the kind of the gas as long as it differs from the solvent gas, which vaporizes from the perovskite precursor solution. The gas may be an atmospheric gas filling a glovebox, a production apparatus or the aerial environment. Preferred examples of the gas include nitrogen and rare gases such as helium, neon and argon. It is also possible to adopt air, oxygen or carbon dioxide. Those gases can be used singly or in a mixture. Nitrogen gas is preferred because it is inexpensive and can be isolated to use from air. The gas contains water in an amount of normally 50% or less, preferably 4% or less. On the other hand, the lower limit of the water content is preferably 10 ppm. Further, the gas may contain vapors of liquid substances at room temperature. Examples of the liquid substances at room temperature include: N,N-dimethylformamide (DMF), γ-butyrolactone, dimethyl sulfoxide (DMSO), chlorobenzene (CB) and dichlorobenzene (DCB). Those vapors are expected to have effects on improving smoothness and the crystal structure.

The gas is preferably kept at 30° C. or below. According as the gas temperature rises, the materials of the perovskite structure become more soluble in the coating solution and hence it becomes difficult to form the perovskite structure.

On the other hand, the temperature of the substrate is preferably lower than that of the gas. Specifically, it is preferably 20° C. or below, more preferably 15° C. or below.

The gas-blowing procedure is preferably carried out before the reaction is completed to form the perovskite structure in the coating solution. This means that the crystals or the precursor compounds thereof are preferably oriented by gas-blowing, so that the reaction is promoted. It is preferred to start gas-blowing immediately after the coating solution is cast to form a film. Specifically, it starts preferably within 10 seconds, more preferably within 1 second. While the coating solution is being dried, crystals of simple substances, such as MAI and lead iodide, contained as the materials may grow simultaneously with formation of the perovskite structure. The sooner the materials dissolved or dispersed in the coating solution are dried, the more efficiently the perovskite structure can grow. The method of the embodiment is effective in forming the perovskite structure on an organic film or on an oxide having large lattice mismatch. The coating film may contain a part of the precursor compounds, for example, an iodide such as lead iodide, but preferably the film contains all the precursor compounds for the perovskite structure.

In the present embodiment, the gas is preferably blown so that a laminar flow of the gas can be formed on the surface of the active layer. Here, "laminar flow" means a gas flow in which the upper and lower streams can be determined in one axial direction on the surface of the coating film. There may be microscopic turbulence in the flow. If the gas flows in a specific direction on the coating film surface during growth of the perovskite crystals, it is thought that the perovskite structure and the precursors thereof undergo crystal growth parallel to the direction. In this way, the gas-blowing procedure can promote anisotropic crystal growth eventually. The gas is blown at an angle of less than 90°, preferably less than 80° to the film surface. The smaller the angle is, the more similarly the crystals grow oriented. However, in order to accelerate the crystal growth, the gas is preferably blown at an angle of more than 0°. In consideration of the crystal orientation and the crystal formation rate, the blowing angle is preferably 0 to 10°. If the gas is blown in that manner, the path of the gas-flow can be limited so that the flow amount can be decreased remarkably enough to reduce the production cost. After the gas-blowing procedure, the coating film is immersed in an immersion fluid. If not beforehand blown with the gas, the film often separates from the undercoat layer and the fragments thereof scatteringly float in the immersion fluid. The floating film fragments may deposit again to form large bumps on the surface of the resultant perovskite layer. The semiconductor element comprising such a bumpy perovskite layer has poor conversion efficiency because leak structures are formed therein. Particularly if containing DMSO, the precursor solution is difficult to dry after the coating procedure and therefore the above problem is very serious.

The gas is preferably so blown as to flow fast near the surface of the coating film. Specifically, the gas is generally blown through a nozzle, whose tip is preferably pointed toward the coating surface and also preferably positioned near the coating surface.

The flow velocity of the gas is preferably controlled to obtain the effects of the embodiment. The gas is preferably made to flow fast near the surface of the coating film because the reaction tends to proceed rapidly to form the perovskite structure according to the flow velocity. However, in view of avoiding tremors on the film surface caused by the gas flow, the flow is preferably slow.

After the procedure of gas-blowing, the coating solution containing the precursor compounds for the perovskite structure may be further cast once or more again. It can be carried out by means of spin coater, slit coater, bar coater, or dip coater. The solution is preferably so cast as to form a relatively thin film because the active layer formed from the first coating solution tends to be a lattice mismatch layer. Specifically, the thin film is preferably formed under such a condition that the spin coater is rotated at a relatively high speed, that the slit or bar coater is used with a relatively narrow slit, that the dip coater is used at a relatively high pulling-up speed or that the coating solution contains the solutes in relatively low concentrations.

Meanwhile, also in a conventional method called "2-step method" or "sequential deposition method", the coating film is blown with a gas after the reaction is completed to form a perovskite structure, that is, after the coating film is completely colored. However, that procedure is carried out only for the purpose of drying the solvent component. If the element includes a mesoporous structure or comprises an undercoat layer of titanium oxide or aluminum oxide, they may promote crystallization of the perovskite structure and hence the gas-blowing procedure has some effect in the conventional method. However, it has little effect on the reaction for forming a perovskite structure on an organic film or on an oxide having large lattice mismatch. As described above for the embodiment, if the perovskite structure is intended to be formed on an organic film or on an oxide having large lattice mismatch, the coating film is blown with a gas before the reaction is completed to form the perovskite structure, so as to promote the reaction and thereby to inhibit structural defects, such as pinholes, cracks and voids. The gas-blowing procedure of the embodiment is carried out when the materials are partly applied before the perovskite structure is completely formed, and the procedure is very effective in forming the perovskite structure on an organic film or on an oxide having large lattice mismatch.

After blown with the gas, the coating film is immersed in an immersion fluid to extract the solvent remaining therein. There are no particular restrictions on the immersion fluid as long as it can extract the remaining solvent preferentially to the perovskite precursor compounds. Examples thereof include: chlorobenzene, dichlorobenzene, toluene, anisole and diethyl ether. Particularly preferred immersion fluid are chlorobenzene and dichlorobenzene because they are suitable for extraction of DMSO and hardly extract the perovskite precursor compounds. The immersion procedure has an effect of proceeding growth and expansion of the perovskite structure in the whole coating layer. The perovskite structure grows from seeds, which are the perovskite crystals formed in the gas-blowing procedure, the precursor compounds therefor, or compounds formed form the precursor compounds and DMSO. Accordingly, the gas is preferably blown in such a laminar flow that the perovskite crystals, the precursor compounds therefor or the compounds formed form the precursor compounds and DMSO can be regularly arranged. In the manner described above, the anisotropic perovskite structure can be formed.

After the gas-blowing procedure, the perovskite layer is preferably annealed and thereby dried to remove the solvent. For the purpose of removing the solvent from the perovskite layer, the annealing procedure is preferably carried out before the perovskite layer is coated with the buffer layer but after the solvent-extraction procedure. The annealing temperature is preferably 50° C. or more, further preferably 90° C. or more, but preferably 200° C. or less, further preferably 150° C. or less. If it is too low, there is a problem of removing the solvent insufficiently. On the other hand, if the temperature is too high, the surface of the perovskite layer may be roughened too seriously to obtain a smooth surface.

(Formation of Second Buffer Layer and Undercoat Layer)

Subsequently, according to necessity, the second buffer layer and/or the undercoat layer are formed thereon. They can be formed in desired manners.

(Formation of Second Electrode)

After the second buffer layer or the undercoat layer is formed according to necessity, the second electrode is formed in the same manner as that for the first electrode.

The semiconductor element produced in the above-described manner comprises the active layer having anisotropy, and is so excellent in durability and evenness as to be a large-area element usable as an efficient photoelectric conversion or light-emitting device.

EXAMPLES

In conventional evaluation tests of elements comprising perovskite structures, the power generation areas of evaluated samples were as small as about 2 mm squares. The elements comprising perovskite structures are generally produced in film-forming processes including reactions of crystal growth, and hence have problems in that internal stress is induced by volume shrinkage to generate pinholes or to cause intercoat adhesion failures. For that reason, it was difficult to produce layered structures having small amounts of structural defects. Accordingly, in mass-production processes, conversion efficiencies of the products were poor in reproducibility and varied in a wide range. Although there were some cases where a portion of the products happened to have defects fortuitously in small amounts and to show irregularly high conversion efficiencies, it was difficult to obtain high conversion efficiencies regularly and widely.

However, in view of practical use, it is necessary to manufacture elements capable of realizing high conversion efficiencies in wide ranges. In the following examples, therefore, elements having power generation areas of 1 cm squares were produced and evaluated. In a normal solar cell-manufacturing process including a coating procedure, cells in shapes of 1 cm-width strips are sequentially arranged. Accordingly, the elements having power generation areas of 1 cm squares are suitable in size for serving as samples of practical module performance.

Example 1

Figure 3:
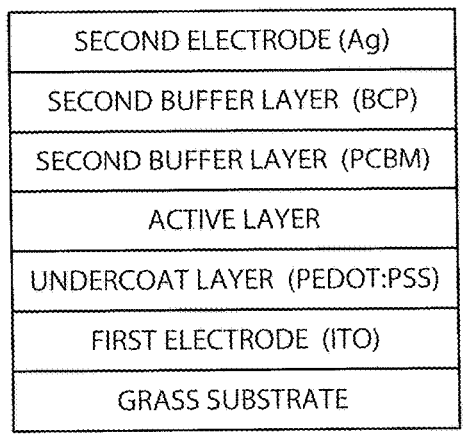
FIG. 3 is a schematic sectional view of the element in Example 1.

An element having the structure shown in FIG. 3 was produced. First, an ITO film as the first electrode was formed on a glass substrate, and an undercoat layer containing PEDOT:PSS was then formed thereon. The PEDOT:PSS layer was intended to serve also as a hole transport layer. For forming the PEDOT:PSS layer, HIL1.1 ([trademark], manufactured by Heraeus GmbH) was applied by spin-coating at 5000 rpm and then dried at 140° C. for 10 minutes. Thereafter, a precursor solution for forming a perovskite layer (MAPb($I_{(1-x)}Br_x$)$_3$) is applied. In order to prepare the solution, methylammonium iodide, methylammonium bromide and lead iodide were dissolved as the precursor compounds in a mixed solvent consisting of DMF and DMSO in a volume ratio of 3:1. The concentrations of methylammonium iodide, methylammonium bromide and lead iodide were controlled to be 159 mg/ml, 112 mg/ml and 461 mg/ml, respectively. After the prepared solution was two-fold diluted, the perovskite layer was formed by the film-forming process described later. Subsequently, PCBM was dissolved in dichlorobenzene (DCB) so that the content thereof might be 20 mg/ml to prepare a solution, which was then applied by spin-coating on the formed active layer at 5000 rpm. Further, a layer of BCP was formed thereon in 10 nm thickness by vacuum deposition. Those layers of PCBM and BCP were intended to be a second buffer layer functioning as an electron transfer layer. After that, the buffer layer was coated with Ag by vacuum deposition to form a second electrode of 100 nm thickness.

Figures 4A, 4B, 4C, 4D:
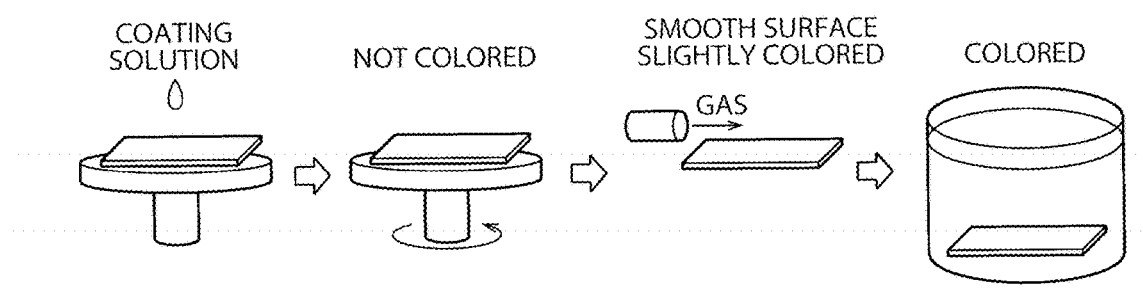
FIGS. 4A, 4B, 4C and 4D illustrate a process for producing the active layer in Example 1.
Figure 5:
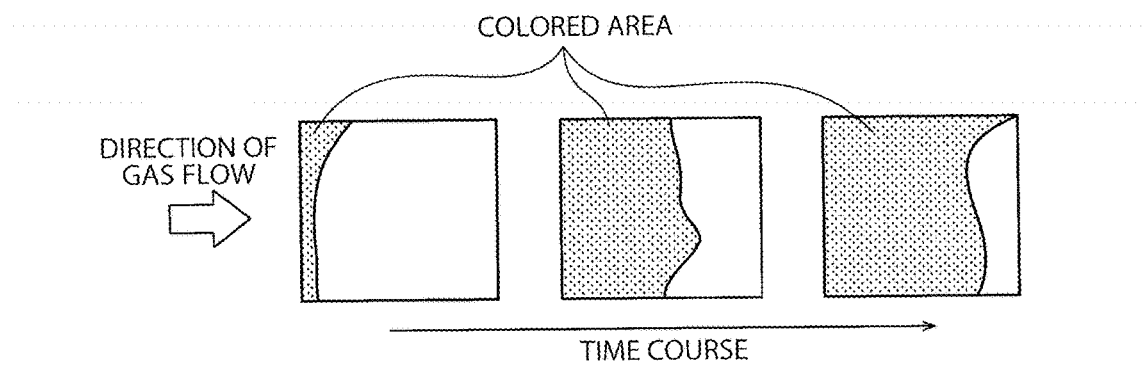
FIG. 5 schematically shows appearance of crystal formation in producing the active layer.

The perovskite layer was produced by the process illustrated in FIGS. 4A, 4B, 4C and 4D. After the PEDOT-containing undercoat layer and other layers placed thereunder were formed, the glass substrate provided with those layers was placed on a spin-coater stage and then the coating solution for the perovskite layer was dropped thereto (FIG. 4A). Subsequently, the substrate was subjected to spin-coating at 3000 rpm for 2 seconds (FIG. 4B). Since containing DMSO, the solution only formed a coating film and was not completely dried in this step. The substrate was then transferred into an apparatus for gas-blowing (FIG. 4C). In the apparatus, the gas flowed in a specific direction to the coating film for forming the perovskite layer. During the gas-blowing procedure in the apparatus, the coating film gradually became colored from the upper stream side, as shown in FIG. 5. The crystal growth proceeded in that way.

Figure 6:
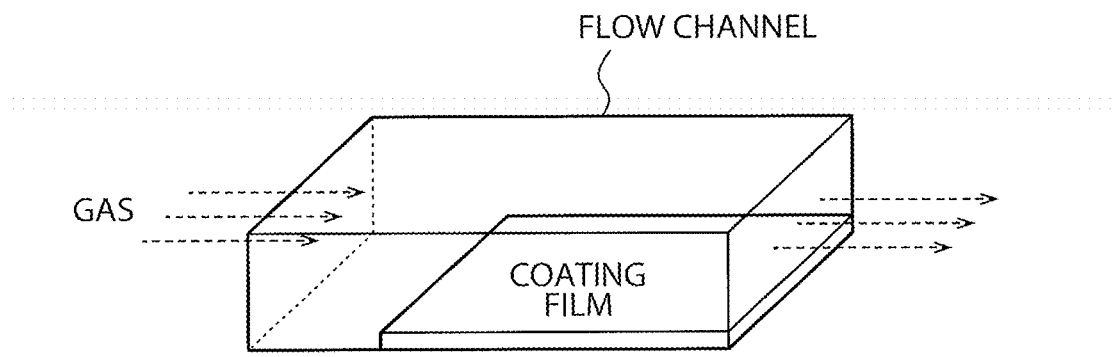
FIG. 6 schematically shows an example of the apparatus for gas-blowing.
Figure 7:
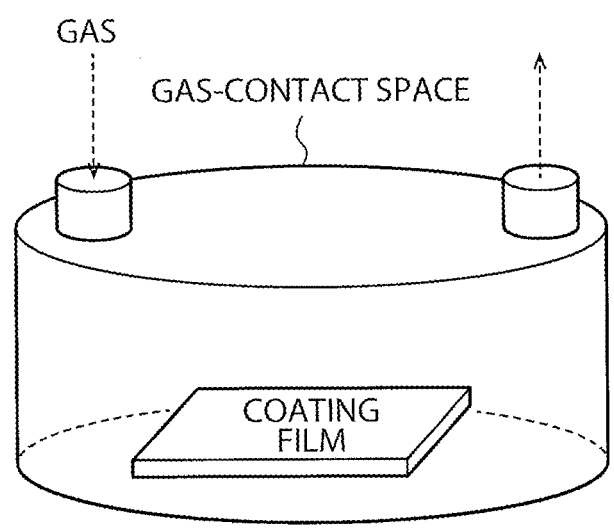
FIG. 7 schematically shows another example of the apparatus for gas-blowing.

There are no particular restrictions on the method of gas-blowing as long as the crystals are arranged in an anisotropic orientation. Accordingly, the gas may be blown in other ways. For example, although the gas shown in FIGS. 4A, 4B, 4C and 4D is blown parallel to the coating film, the gas may be blown obliquely. Further, it is also possible to adopt apparatuses shown in FIGS. 6 and 7. FIG. 6 shows an apparatus having a structure in which the gas flows in a specific direction to the coating film placed in a limited flow channel, and FIG. 7 shows another apparatus having a structure in which the gas flows in a specific direction in a limited contact space. If the gas is blown in a flow rate of 0.83 m/s, the coating film often becomes in a state different from either an undried wet film or a colored film finally obtained by gas-blowing. The film in that state appears clouded, and this appearance is thought to be due to intermediates formed from $ABX_3$ with the solvent molecules. The film preferably undergoes that intermediate state. After the gas-blowing procedure, the film is immersed in an immersion fluid to extract the remaining solvent (FIG. 4D). As the immersion fluid, chlorobenzene was used. Finally, the film was annealed on a hot-plate. In the annealing procedure, the film was continuously heated at 40° C. for 20 minutes, at 50° C. for 15 minutes, at 60° C. for 15 minutes, or at 70° C. for 30 minutes.

Figure 8:
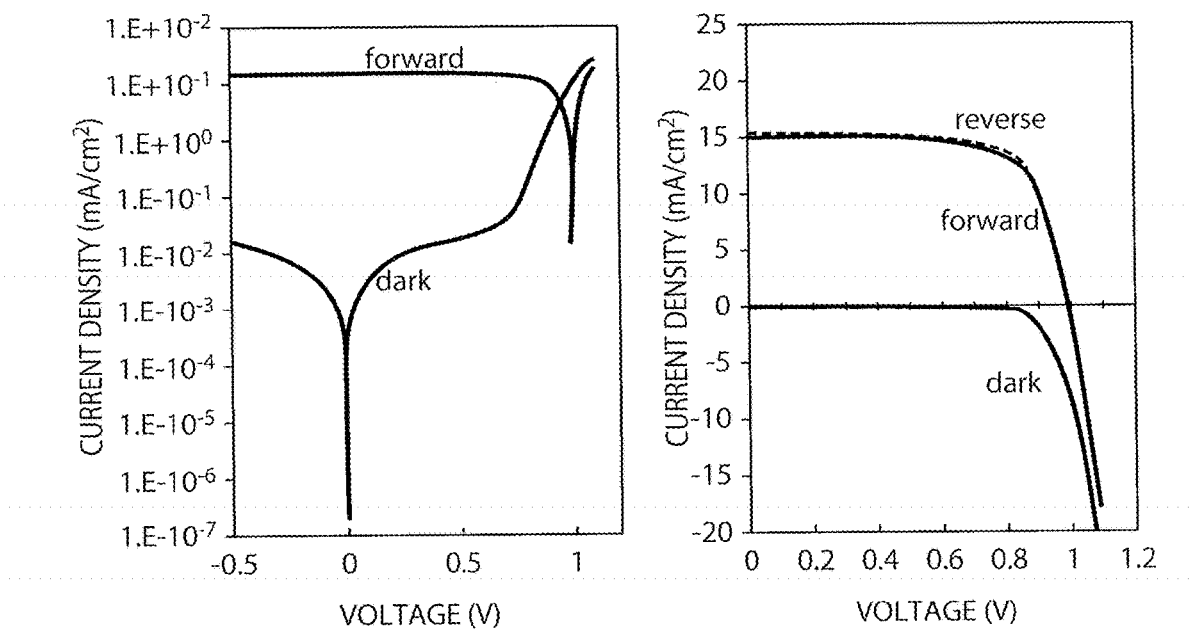
FIG. 8 shows I-V characteristics of the element in Example 1.
Figure 9:
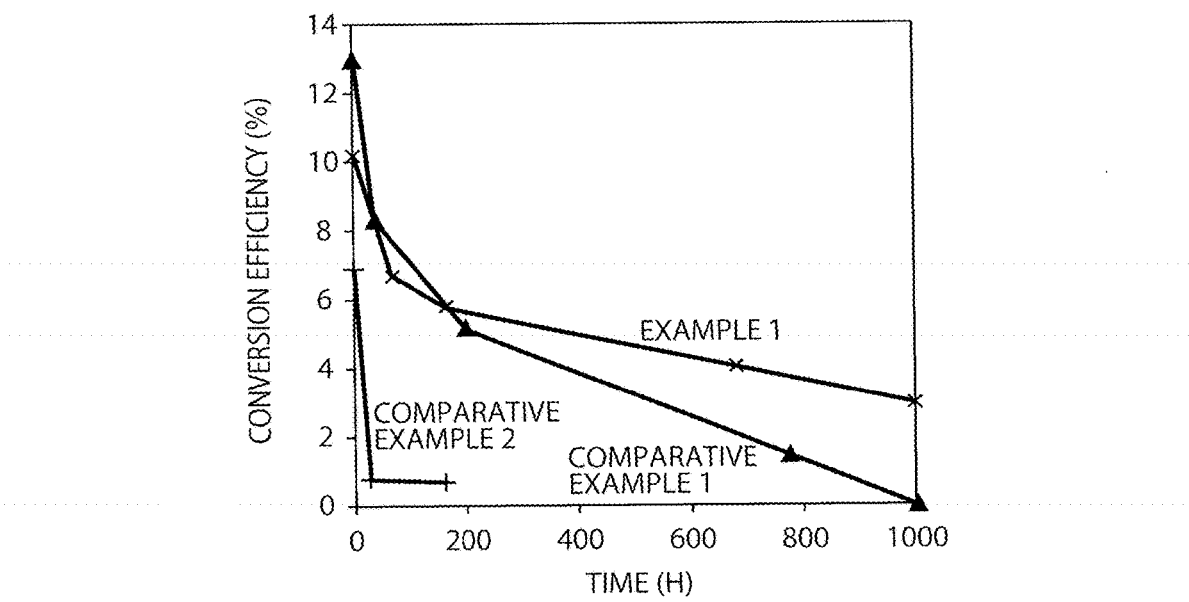
FIG. 9 shows conversion efficiencies of the elements in Example 1 and Comparative examples 1 and 2.

The I-V characteristics of the element thus produced were measured by means of a solar simulator under the conditions of AM 1.5 and 1000 W/cm$^2$. As shown in FIG. 8, the conversion efficiency was found to be 10.9% (power generation area: 1 cm$^2$). The element exhibited such high semiconductor characteristics that the ideal factor was 1.9. The dark current was also found to be small. The produced element was placed in a sealed container manufactured by Swagelok Company, and then the container was placed in an oven set at 85° C. While the element was kept heated, the conversion efficiency thereof was measured several times. The results are shown in FIG. 9, which indicates that the element could keep about 30% of the initial efficiency even after 1000 hours.

The above procedure was repeated to produce a sample in which the perovskite layer and other under-layers were laminated. The sample was subjected to oblique X-ray diffraction measurement. In the measurement, when the incident X-ray of 2θ=0 was applied parallel or perpendicularly to the gas-flow direction, the measured intensity was defined as that in X-direction or in Y-direction, respectively. The results were thus analyzed in two directions. FIG. 10 shows an X-ray diffraction profile in a range including a peak corresponding to the (220) face. In the profile, the peak intensities in X- and Y-directions were found to be 161.30 and 143.11, respectively, and hence the difference thereof was 18.19. The maximum SN ratio was also found to be 23.3. The intensity in X-direction was divided by the maximum SN ratio to obtain a value of 6.9, which was estimated to be an error margin. It was found that the diffraction peak corresponding to the (220) face was enhanced by about three times the error margin.

Table 1 shows the peak intensities corresponding to the (110), (224) and (310) faces.

TABLE 1

|  | 2 θ | | | |
| --- | --- | --- | --- | --- |
|  | 14.08 | 28.40 | 31.84 | 40.70 |
|  | Face | | | |
|  | (110) | (220) | (310) | (224) |
| Intensity in X-direction | 250.30 | 161.30 | 121.11 | 77.64 |
| Intensity in Y-direction | 267.33 | 143.11 | 106.10 | 72.05 |
| Difference | −17.03 | 18.19 | 15.01 | 5.59 |
| Error margin | 10.7 | 6.9 | 5.2 | 3.3 |

*Error margin = Intensity in X-direction/SN ratio (23.3)

The above table indicates that the peak intensity corresponding to the (110) face was weaker in X-direction than in Y-direction by more than the error margin. The peak intensity of the (110) face was weakened because of interference with that of the (220) face according to Bragg's law. This clearly indicates that the (110) and (220) faces were oriented in X-direction rather than in Y-direction. On the other hand, the (224) face is inclined at an angle of about 10° to the (110) and (220) faces. Accordingly, the X-ray diffraction intensity was so weak that the difference between in X- and Y-directions was too small to estimate the anisotropy. Meanwhile, the (310) face is inclined at an angle of about 18° to the (nn0) faces provided that the angle is centered on the C-axis of the unit cell, and accordingly showed weak diffraction intensities. However, the intensities of the (310) face are hardly influenced by other peaks, and hence are the second most suitable for estimating the anisotropy, next to those of the (220) face. As shown in FIG. 10, there was no difference in the half width between in X- and Y-directions. This means that the crystallite size was similar in both directions.

FIGS. 11A and 11B each schematically illustrates internal stress generated among crystallites under anisotropic condition (FIG. 11A) and under isotropic condition (FIG. 11B). For the purpose of roughly evaluating the stress, the shapes of the crystallites are represented by hexagons and the internal stress is compared at the stress concentration point. The internal stress is generated parallel to the (110) face by crystal phase transition of perovskite. When the internal stress generated in one crystallite is represented by F, that at the concentration point is 3F if the crystallites are isotropically arranged (FIG. 11 B). In contrast, if they are anisotropically arranged, the stress is divided in two grains and accordingly that at the concentration point is reduced to 2F (FIG. 11A). If the internal stress is concentrated at a specific point, the element tends to undergo delamination from that point. The lamination prevents carrier migration and hence lowers the conversion efficiency. The above effect is thus presumed to enable the photoelectric conversion device of Example 1 to generate electric power even after 1000 hours.

Comparative Example 1

Another photoelectric conversion device was produced. The perovskite layer of the device was formed in a different manner. Except for that, the structure of the device, the film-forming conditions and the like were the same as those described above. The undercoat layer was spin-coated at 800 rpm with the precursor solution for forming the perovskite layer. In the spin-coating procedure, first the solution was dropped and then gas-blowing was started before the absorption spectrum of the coating film changed into that of the perovskite structure. When the absorption spectrum of the perovskite structure was observed, gas-blowing was stopped. In the gas-blowing procedure, nitrogen gas was blown in an amount of 8 L/minute from a nozzle having an inner diameter of 8 mm. The nozzle was placed so that the nozzle tip was positioned on the normal line at the center of the substrate and in a distance of 5 mm from the substrate. The blowing time was 45 seconds. The perovskite layers of Example 1 and Comparative example 1 were observed from the above, and the results are shown in FIGS. 12A and 12B, respectively. The layer surface of Comparative example 1 is seen to have a circular pattern, where the gas was brought into contact with the film. FIGS. 13A and 13B show sectional profiles measured by means of AFM. As shown in FIG. 13B, the profile of Comparative example 1 partly has as large a height difference as about 400 nm. From this result, it was found that there was a pinhole in the layer of Comparative example 1. In contrast, the profile of Example 1 shown in FIG. 13A has a height difference of not more than 50 nm. Since having no steep height difference, the layer of Example 1 was found to have no pinhole.

The procedure of Example 1 was repeated to carry out the heat-resistance test. The results are shown in FIG. 9. The initial conversion efficiency in the experiment was 12%, which is higher than that in Example 1. However, the conversion efficiency decreased to 0 after 1000 hours. Further, the above production procedure was repeated to prepare a sample in which the perovskite layer and other under-layers were laminated. The sample was subjected to oblique X-ray diffraction measurement. As the result, as for the peak intensities corresponding to the (110) and (220) faces, the differences between in X- and V-directions were found to be not larger than the error margins. The reason why the anisotropy could not be obtained is presumed to because the gas was blown to the sample rotating in the spin-coater. Specifically, the reason is thought to be because the layer was formed concentrically under the same conditions around the spinning center of the spin-coater.

Comparative Example 2

Figure 14:
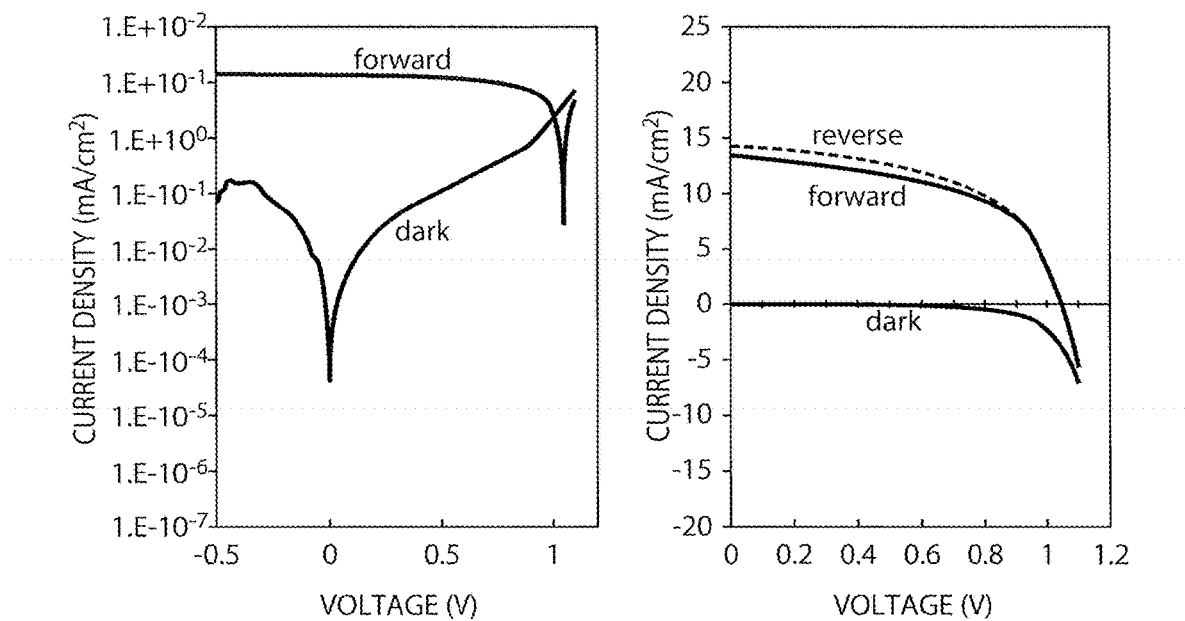
FIG. 14 shows I-V characteristics of the element in Comparative example 1.

Still another photoelectric conversion device was produced. The perovskite layer of the device was formed in a different manner. Except for that, the structure of the device, the film-forming conditions and the like were the same as those described above. After the substrate was placed in the spin-coater, the precursor solution for forming the perovskite layer was dropped and then the substrate began to be rotated. In course of the spin-coating procedure, a poor solvent such as chlorobenzene was dropped to smooth the film. FIG. 14 shows the resultant I-V characteristics. The conversion efficiency and the ideal factor were found to be 7.9% and 3.6, respectively. The values of $R_{sc}$ and $R_s$ are found to be worse than those in Example 1, and this indicates increase of the dark current. FIG. 9 shows the results of the heat-resistance test, and the conversion efficiency steeply went down to 1% or less after about 50 hours.

Comparative Example 3

The procedure of Example 1 was repeated except that the coating film was not blown with the gas and immediately immersed in the immersion fluid, to produce an element.

Figure 15:
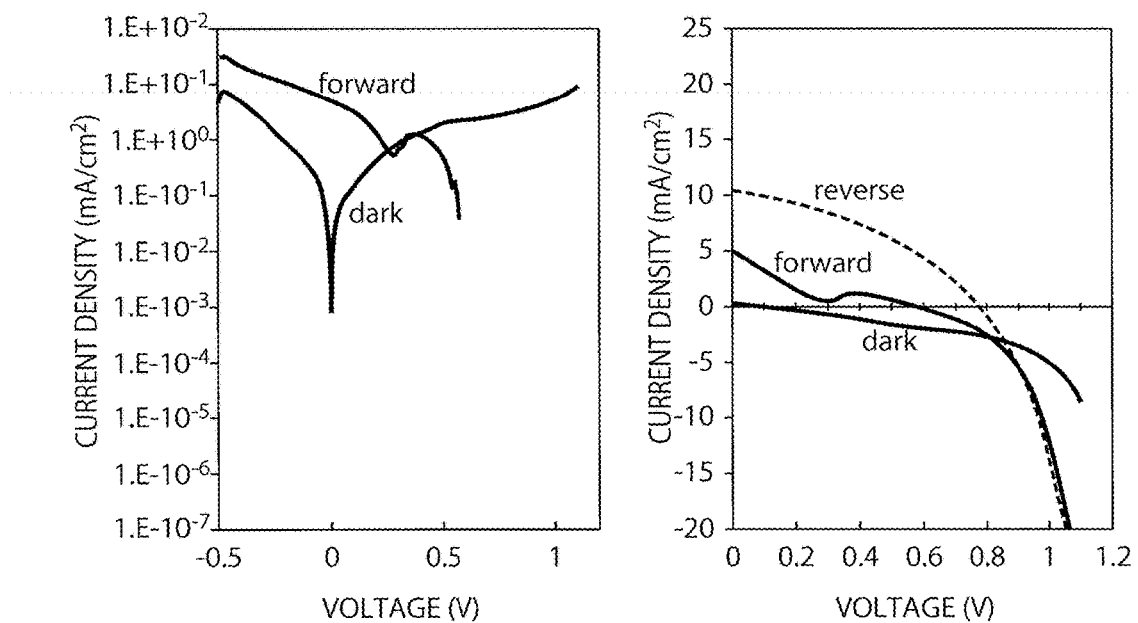
FIG. 15 shows I-V characteristics of the element in Comparative example 3.

As shown in FIG. 15, the obtained IV curves have poor FFs. The dark current characteristics were impaired, and the ideal factor was found to be 4.6. The conversion efficiency (reverse) also went down to 2.9%. FIGS. 16A and 16B each shows difference of the surface between when the coating film underwent the immersion (FIG. 16B) and when it did not (FIG. 16A). As shown in FIG. 16A, the surface not immersed was found to have a marble pattern. That suggests uneven crystal growth.

Example 2

Figure 18:
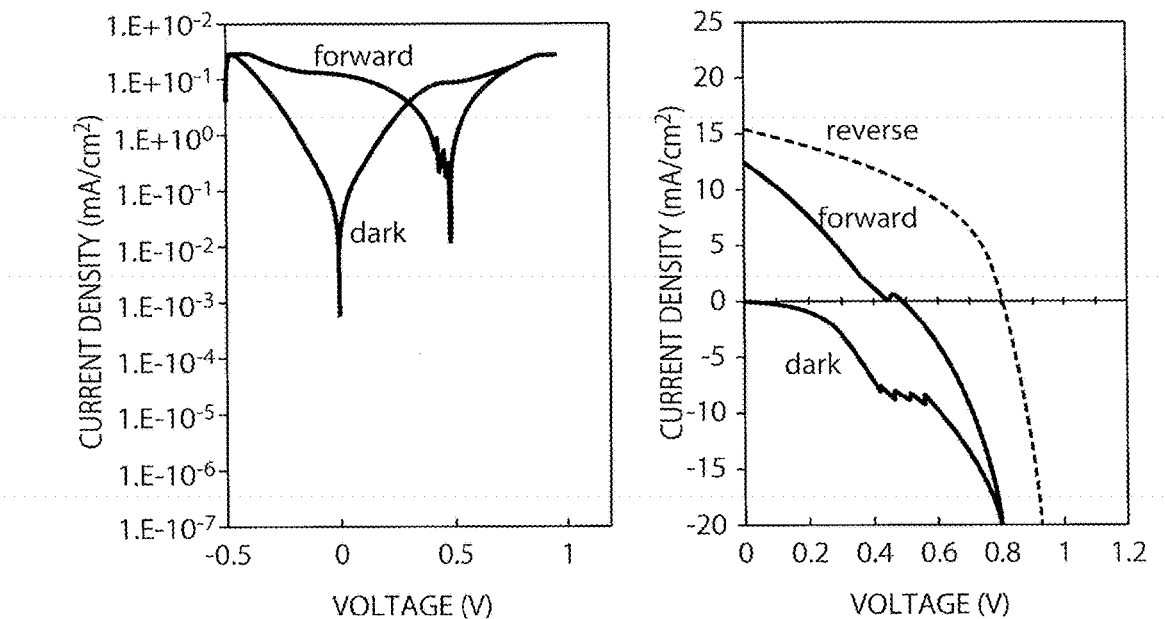
FIG. 18 shows I-V characteristics of the element in Example 2 (immersion time: 60 minutes).
Figure 19:
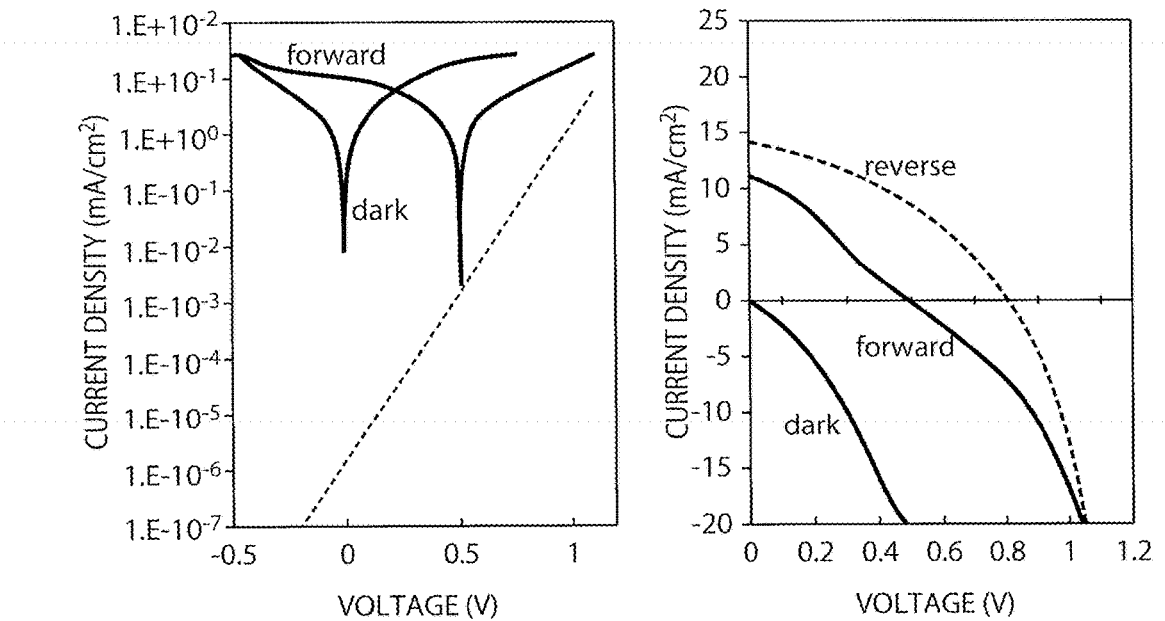
FIG. 19 shows I-V characteristics of the element in Example 2 (immersion time: 120 minutes).

The procedure of Example 1 was repeated except that the coating film was immersed in diethyl ether as the solvent for various periods, to produce elements. The IV characteristics thereof were then measured. In all the following measurements, both forward and reverse IV characteristics were analyzed to obtain hysteresis curves. The perovskite precursor solution was two-fold diluted and then applied. The gas-blowing time was equally 20 seconds in producing all the elements. As shown in FIG. 17, the element subjected to immersion for 30 minutes had conversion efficiencies of 5.4% and 5%. Also, as shown in FIGS. 18 and 19, the elements subjected to immersion for 60 minutes and for 120 minutes had conversion efficiencies of 1.6% and 5.4% and of 1.5% and 4.3%, respectively. Accordingly, it was found that the conversion efficiency decreases and the hysteresis increases in accordance with increase of the immersion time.

Example 3

Figure 20:
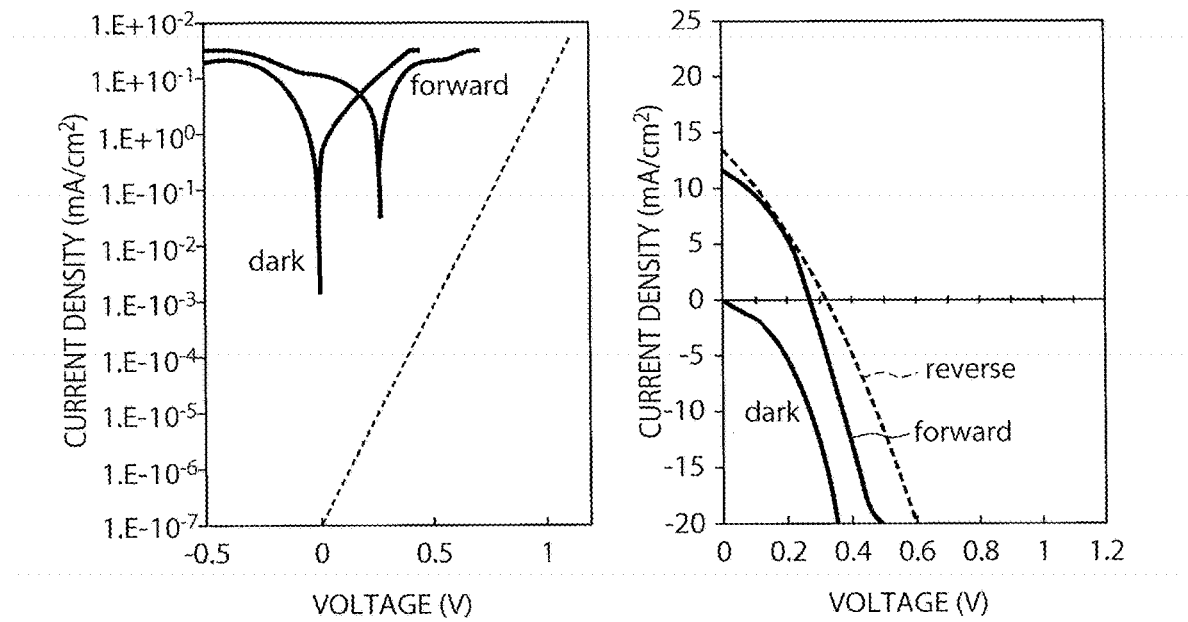
FIG. 20 shows I-V characteristics of the element in Example 3 (blowing time: 50 minutes)
Figure 21:
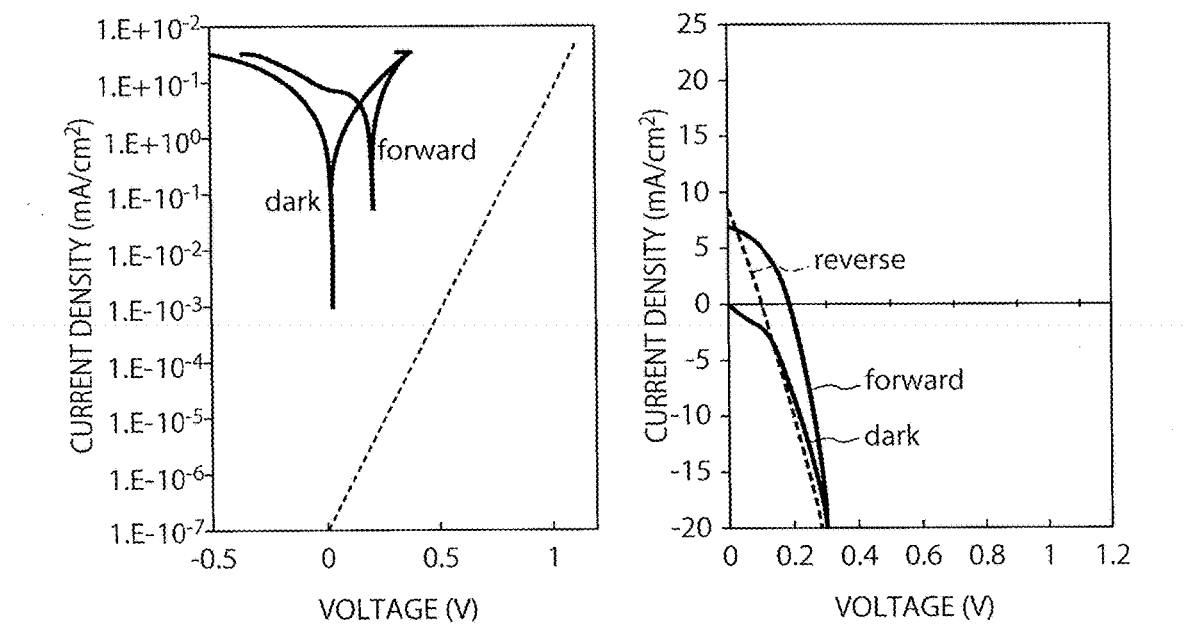
FIG. 21 shows I-V characteristics of the element in Example 3 (blowing time: 65 minutes)

The procedure of Example 2 was repeated except that the perovskite precursor solution was not diluted, to produce elements. FIG. 20 shows IV characteristics of the element subjected to immersion for 60 minutes and to gas-blowing for 50 seconds, and the conversion efficiencies thereof were found to go down to 1.2% and 1.2%. FIG. 21 shows IV characteristics of the element subjected to gas-blowing for 65 seconds, and the conversion efficiencies thereof were found to be 0.5% and 0.2%. Those results suggest that the gas-blowing time is preferably 20 seconds, which is that in Example 2.

Example 4

Figure 22:
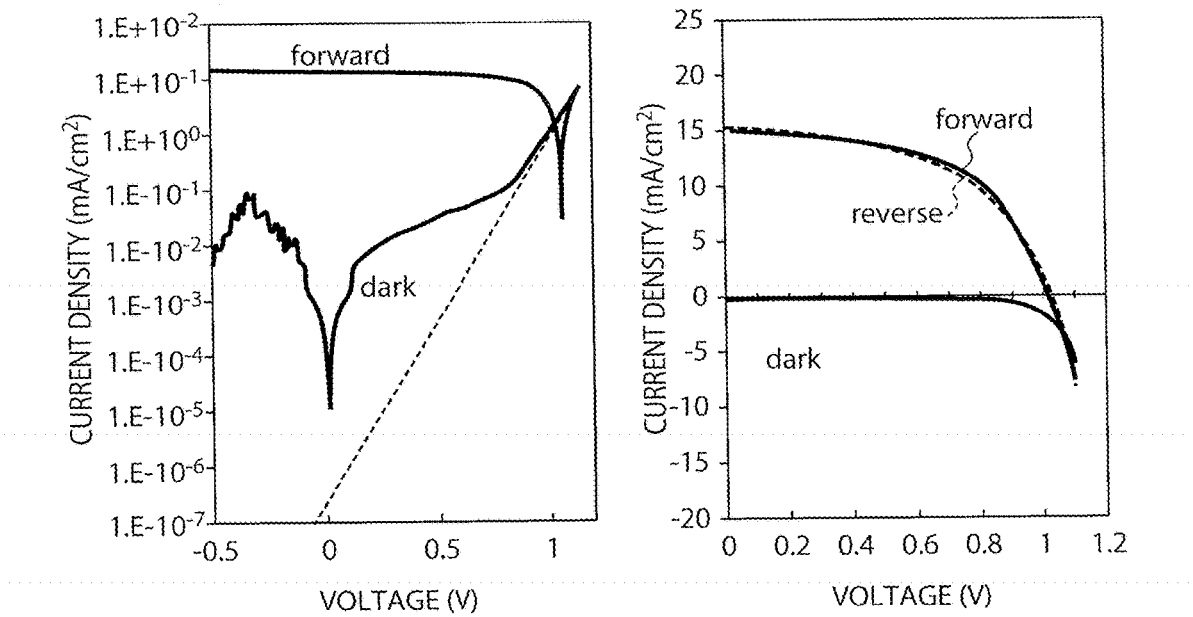
FIG. 22 shows I-V characteristics of the element in Example 4 (immersion time: 3 minutes).
Figure 23:
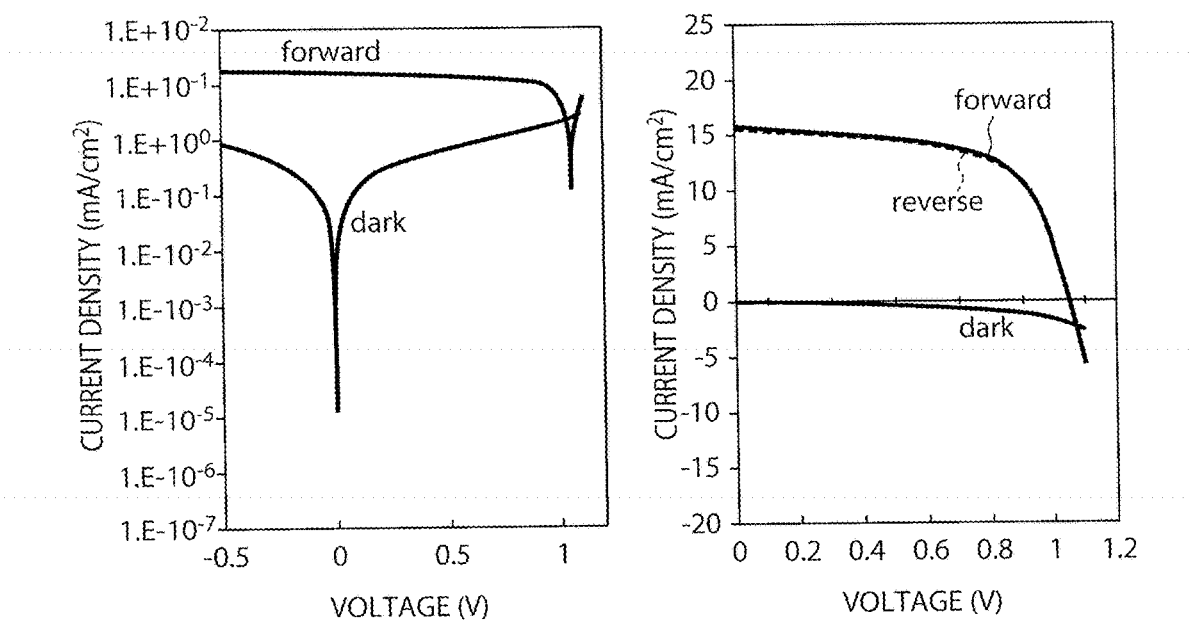
FIG. 23 shows I-V characteristics of the element in Example 4 (immersion time: 15 minutes).
Figure 24:
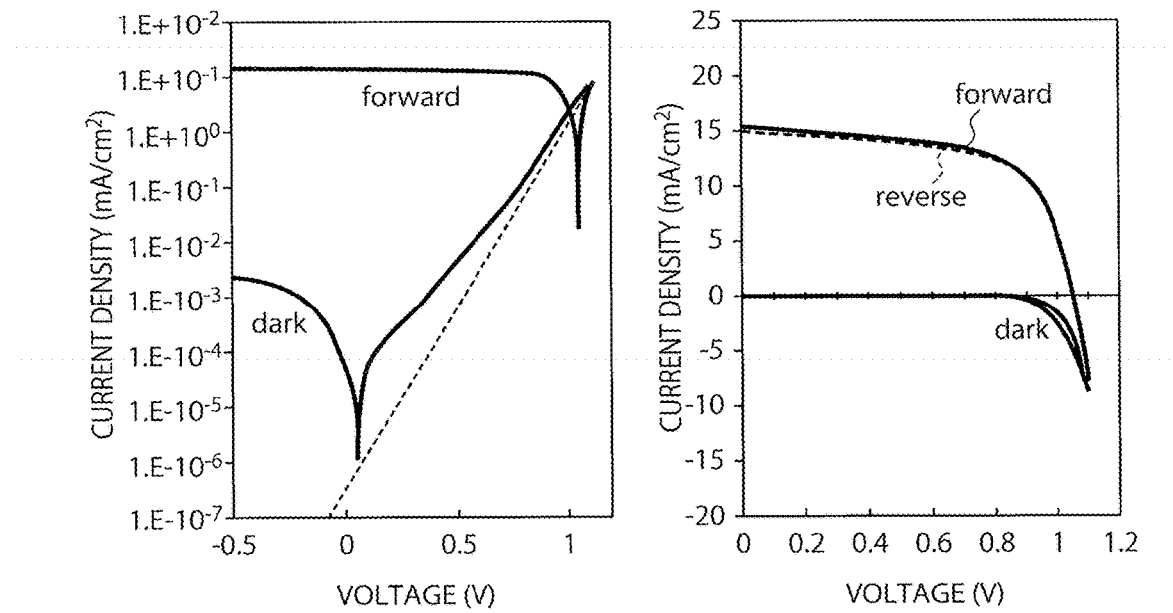
FIG. 24 shows I-V characteristics of the element in Example 4 (immersion time: 30 minutes).
Figure 25:
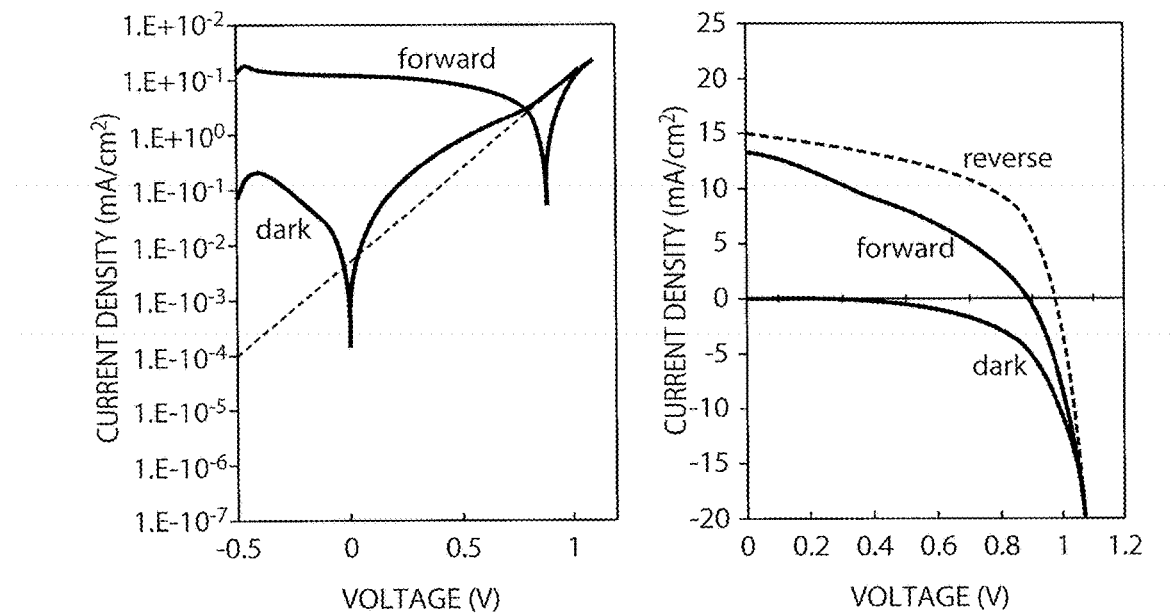
FIG. 25 shows I-V characteristics of the element in Example 4 (immersion time: 60 minutes).

The procedure of Example 2 was repeated except that the coating film was immersed in chlorobenzene as the solvent for various periods, to produce elements. The IV characteristics thereof were then measured. The perovskite precursor solution was two-fold diluted and then applied. The gas-blowing time was equally 50 seconds in producing all the elements. As shown in FIG. 22, the element subjected to immersion for 3 minutes had conversion efficiencies of 8.5% and 8.1%. Also, as shown in FIGS. 23, 24 and 25, the elements subjected to immersion for 15 minutes, for 30 minutes and for 60 minutes had conversion efficiencies of 10.3% and 10.0%, of 10.4% and 10.1% and of 4.2% and 7.5%, respectively. Accordingly, it was found that the immersion time is preferably less than 30 minutes, more preferably 15 to 30 minutes.

Example 5

Figure 26:
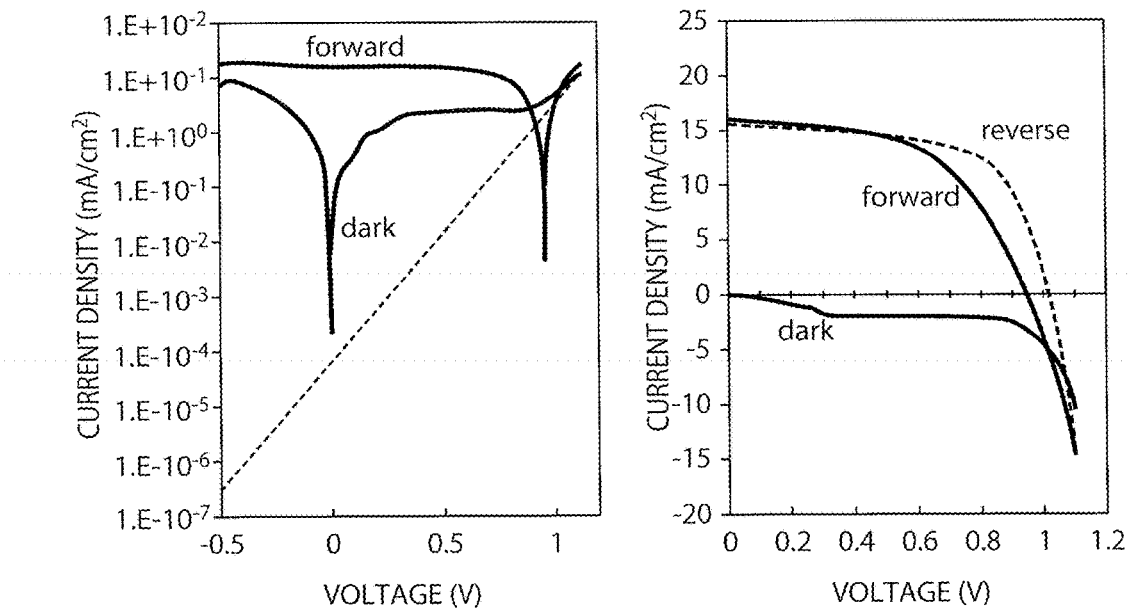
FIG. 26 shows I-V characteristics of the element in Example 5 (immersion time: 3 minutes).
Figure 27:
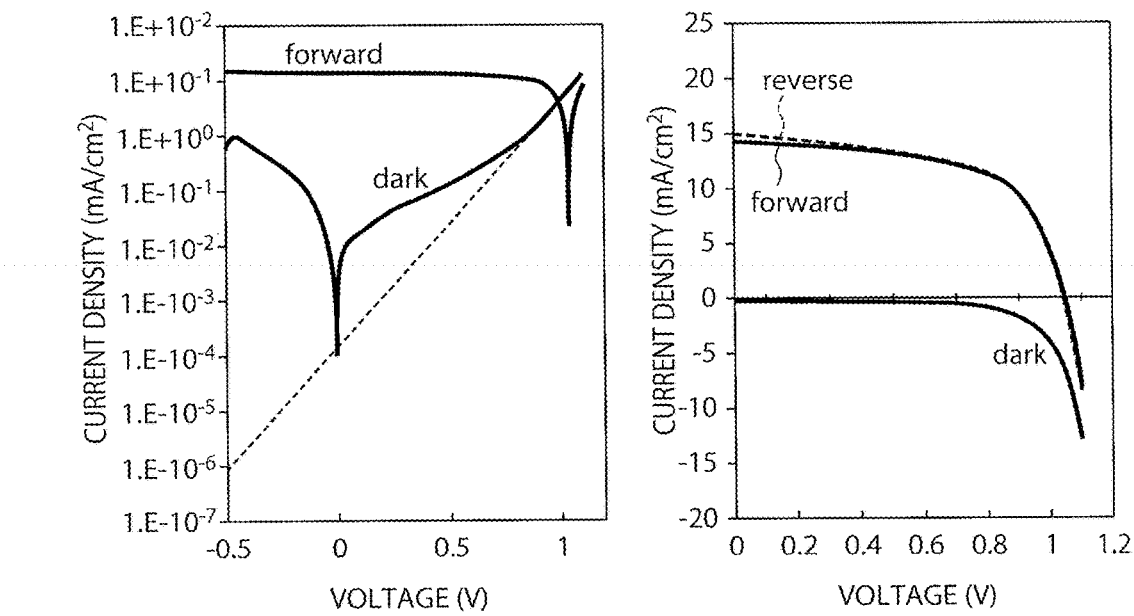
FIG. 27 shows I-V characteristics of the element in Example 5 (immersion time: 30 minutes).
Figure 28:
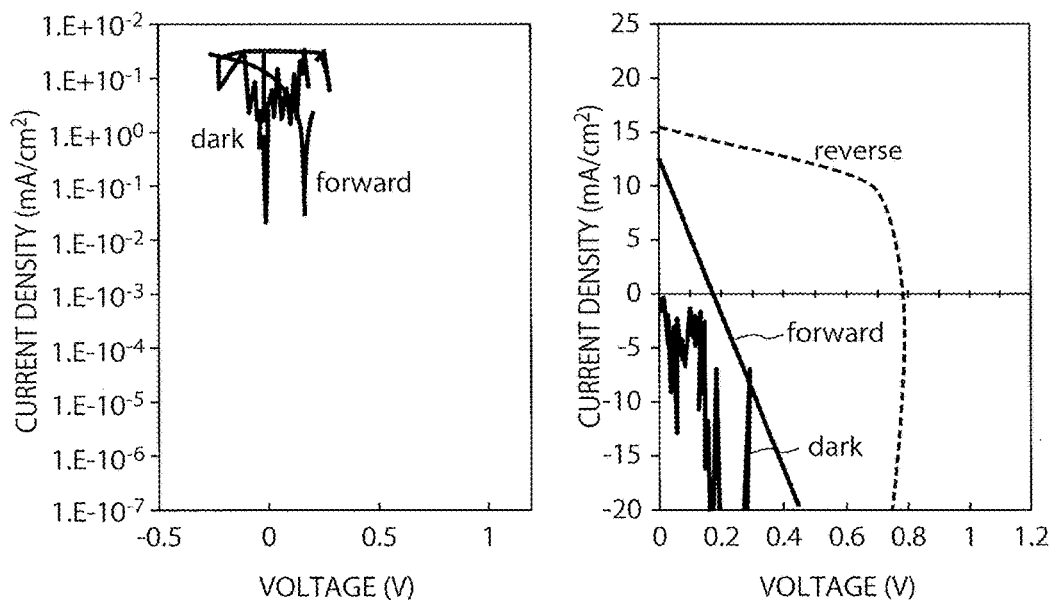
FIG. 28 shows I-V characteristics of the element in Example 5 (immersion time: 60 minutes).

The procedure of Example 2 was repeated except that the coating film was immersed in chlorobenzene as the solvent for various periods, to produce elements. The IV characteristics thereof were then measured. The gas-blowing time was equally 20 seconds in producing all the elements. As shown in FIG. 26, the element subjected to immersion for 3 minutes had conversion efficiencies of 8.2% and 10.1%. Also, as shown in FIGS. 27 and 28, the elements subjected to immersion for 30 minutes and for 60 minutes had conversion efficiencies of 9.5% and 9.6% and of 0.5% and 6.6%, respectively. Accordingly, even if the gas-blowing time is 20 seconds, it was found that the immersion time is also preferably less than 30 minutes.

Example 6

Figure 29:
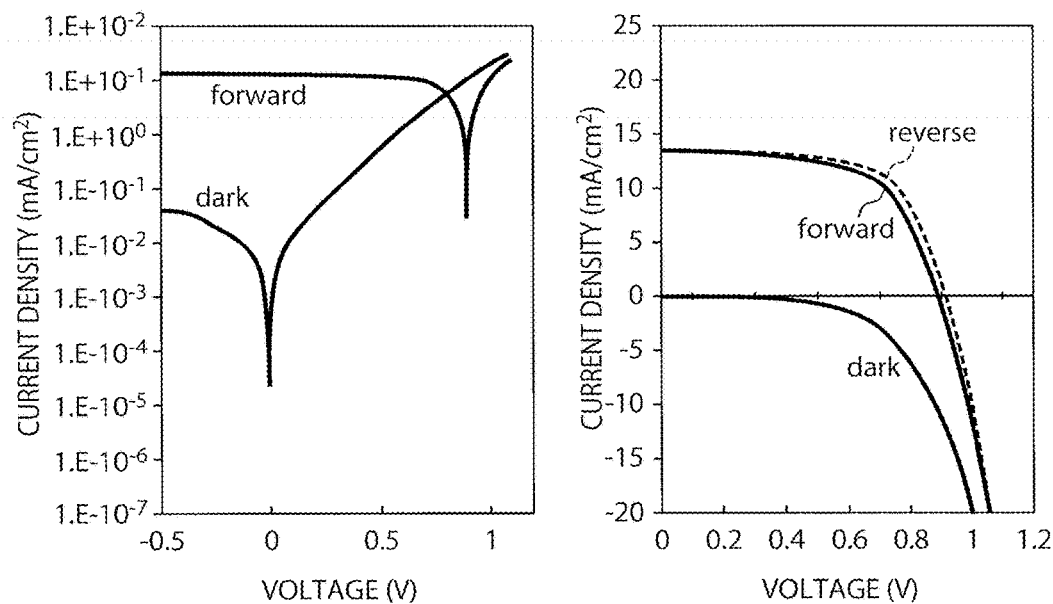
FIG. 29 shows I-V characteristics of the element in Example 6.

The procedure of Example 4 was repeated except for not immersing the coating film in the immersion fluid, to produce an element. The gas-blowing time was 50 seconds. As shown in FIG. 29, the element had conversion efficiencies of 7.5% and 7.8%. They were lower than 10.4% and 10.1%, which are those in Example 4. Accordingly, the conversion efficiency was found to go down if the gas-blowing procedure is omitted. Further, the produced element exhibited a white pattern on the surface, and hence was found to have poor surface nature.

Example 7

Figure 30:
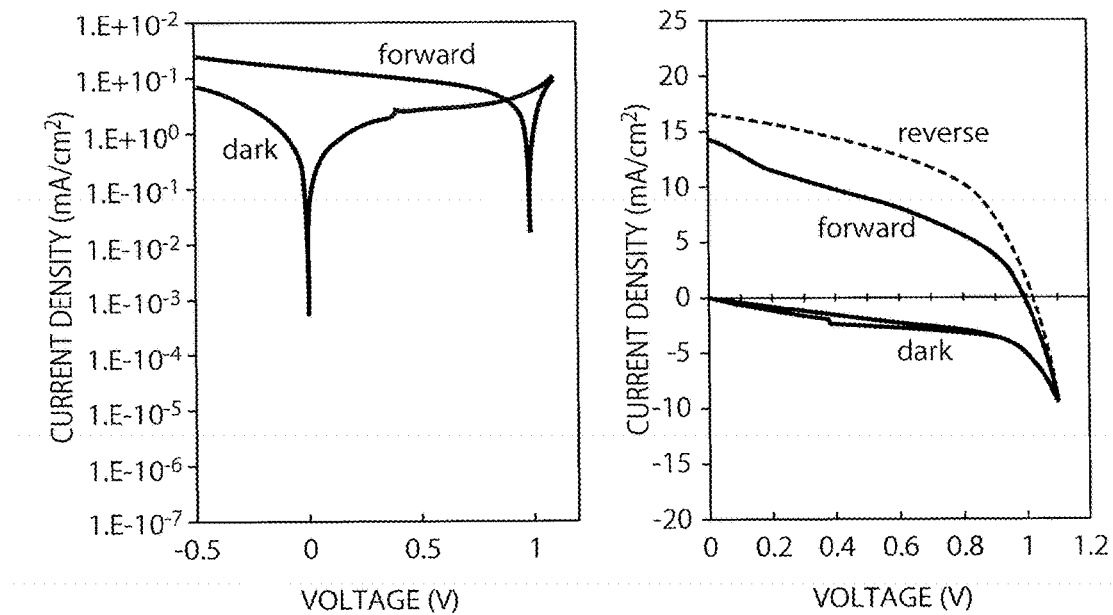
FIG. 30 shows I-V characteristics of the element in Example 7 (immersion time: 30 minutes).
Figure 31:
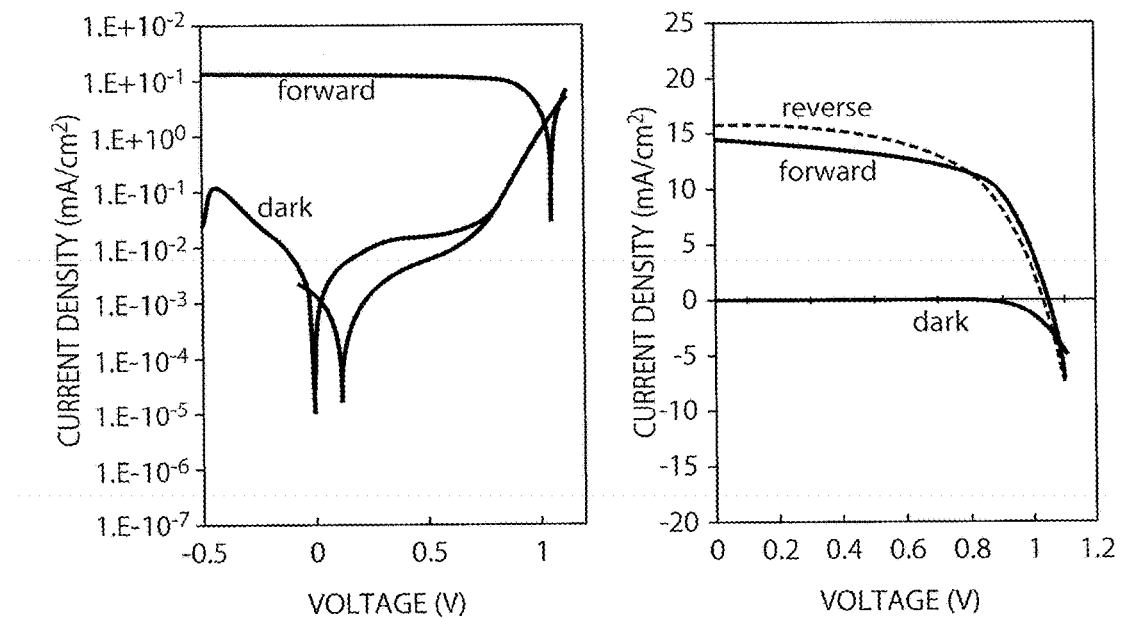
FIG. 31 shows I-V characteristics of the element in Example 7 (immersion time: 45 minutes).
Figure 32:
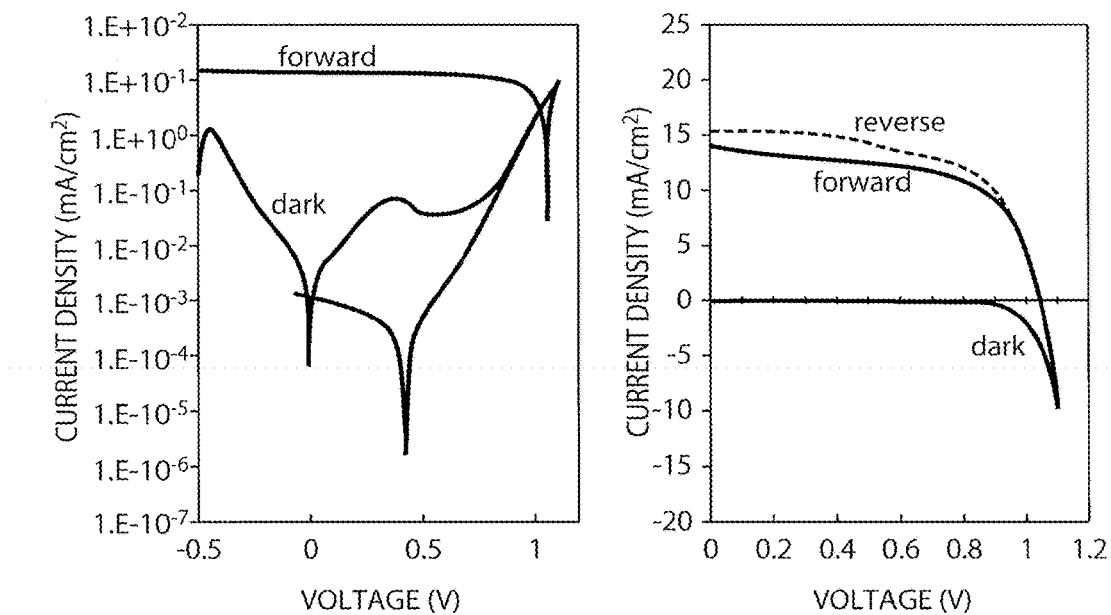
FIG. 32 shows I-V characteristics of the element in Example 7 (immersion time: 60 minutes).

The procedure of Example 4 was repeated except that the perovskite precursor solution was not diluted, to produce elements. As shown in FIGS. 30, 31 and 32, the elements subjected to immersion for 30 minutes, for 45 minutes and for 60 minutes had conversion efficiencies of 5.1% and 8.4%, of 9.2% and 9.2% and of 8.9% and 9.5%, respectively. All those efficiencies are relatively low, and hence it was found that high conversion efficiencies can be obtained if the perovskite precursor solution is diluted.

Example 8

Figure 33:
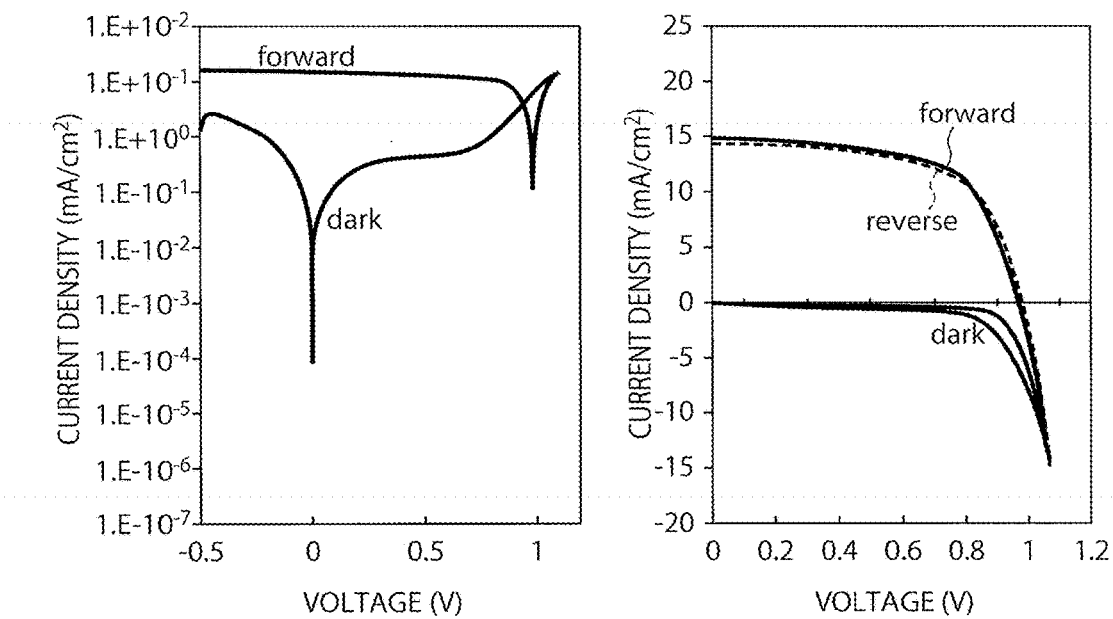
FIG. 33 shows I-V characteristics of the element in Example 8 (annealing time: 10 minutes).
Figure 34:
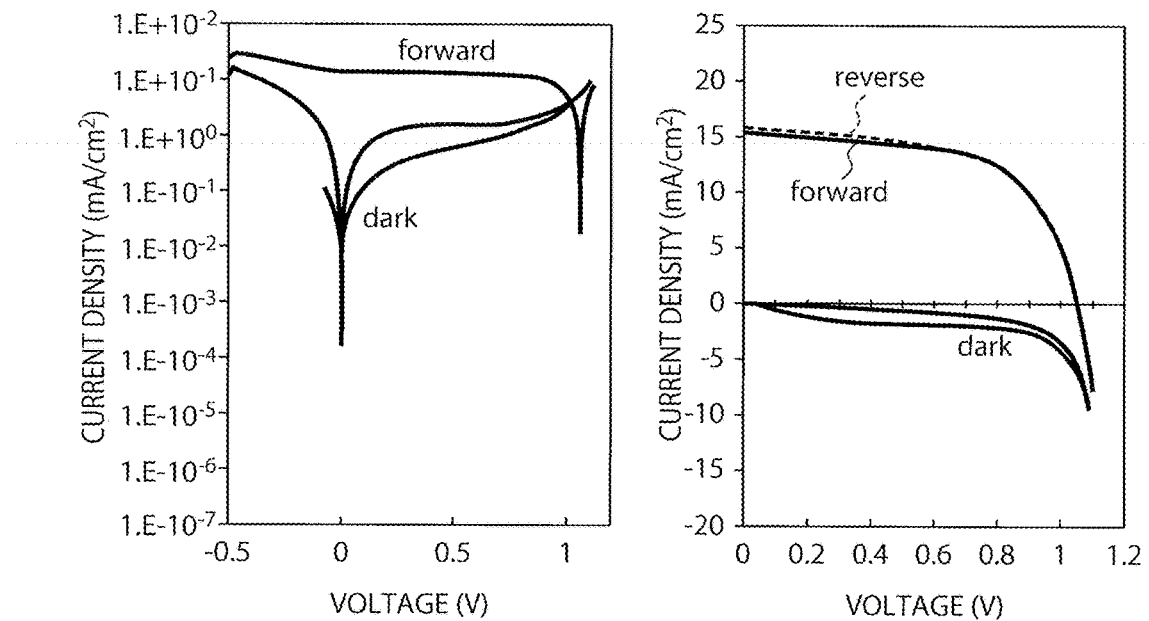
FIG. 34 shows I-V characteristics of the element in Example 8 (annealing time: 60 minutes).
Figure 35:
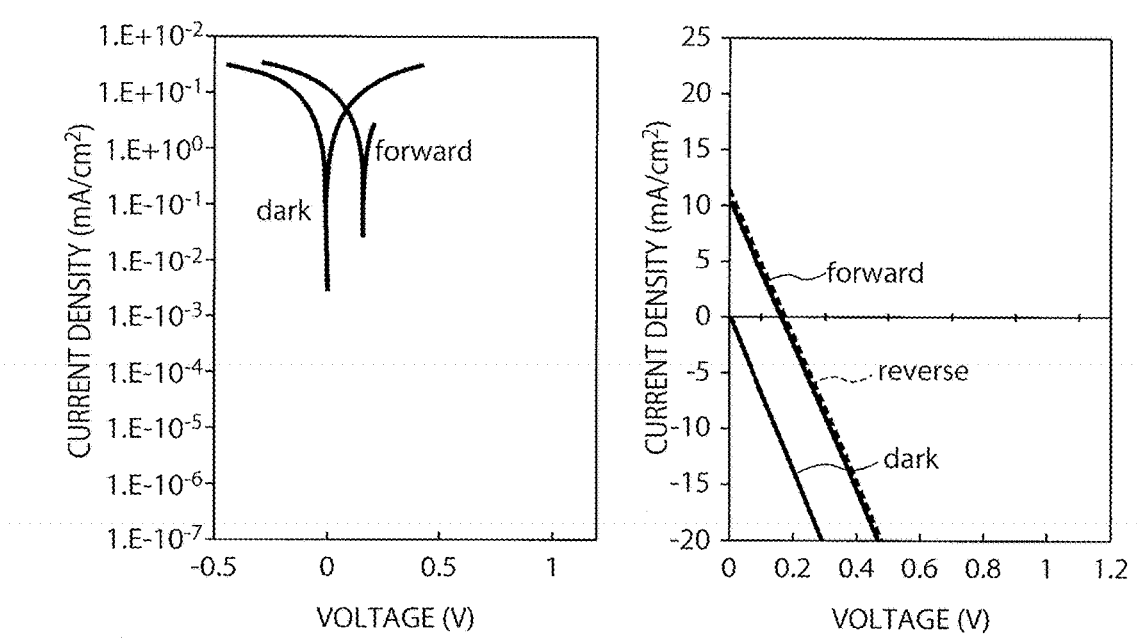
FIG. 35 shows I-V characteristics of the element in Example 8 (annealing time: 3 hours).

The procedure of Example 4 was repeated except that the gas-blowing time and the immersion time were fixed at 50 seconds and 30 minutes, respectively, but that the annealing time was variously changed. As shown in FIG. 33, the element annealed for 10 minutes after the temperature reached 70° had conversion efficiencies of 9.3% and 9.2%. Further, as shown in FIGS. 34 and 35, the elements annealed for 60 minutes and for 3 hours had conversion efficiencies of 10.2% and 10.1% and of 0.46% and 0.48%, respectively. Those results indicate that high conversion efficiencies can be obtained if the annealing time is 30 to 60 minutes.

Example 9

Figure 36A:
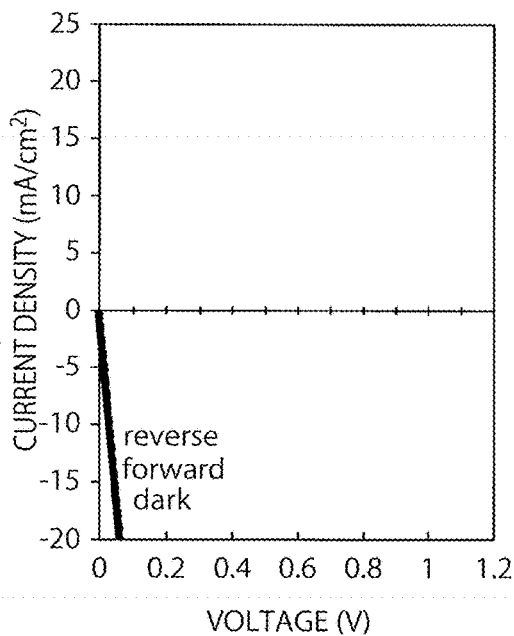
FIGS. 36A-36C show I-V characteristics of the element in Example 9 when the element was subjected to gas-blowing for 0 second (FIG. 36A), for 10 seconds (FIG. 36B) and for 20 seconds (FIG. 36C).
Figure 36B:
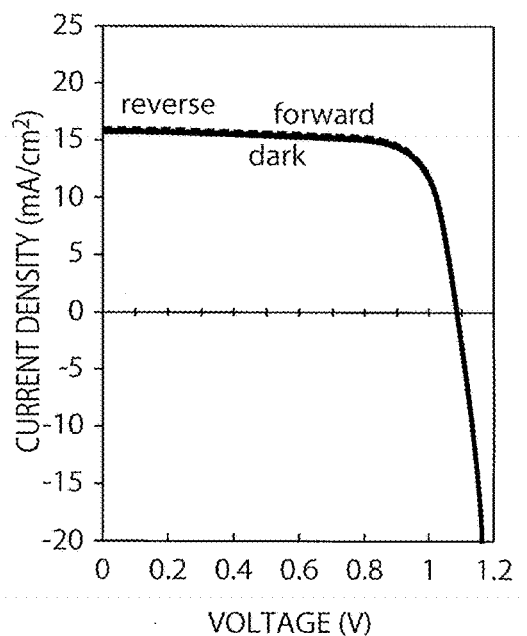
Figure 36C:
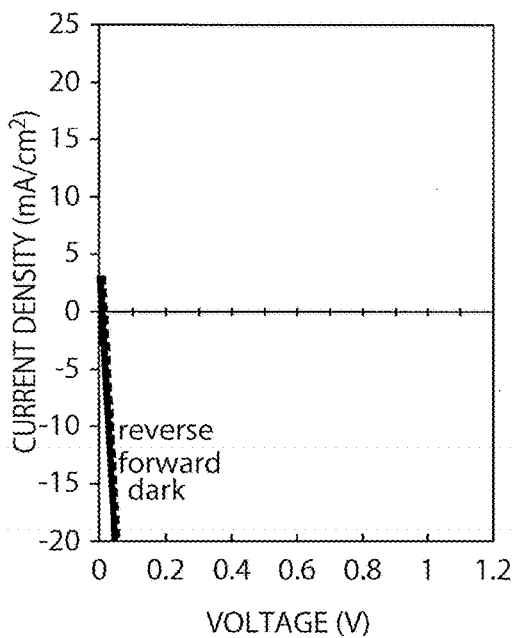

The procedure of Example 1 was repeated except that the undercoat layer was replaced with a $CuO_x$-containing layer. The $CuO_x$ layer was formed by a process comprising the steps of: dissolving copper(II) acetylacetonate in dichlorobenzene so that the concentration thereof might be 1 mg/ml; four-fold diluting the prepared solution; applying the diluted solution by spin-coating at 4000 rpm for 30 seconds: heating the formed film at 80° C. for 20 minutes: and finally spin-coating the heated film with methanol at 3000 rpm for 60 seconds. The immersion time and the annealing time were changed into 30 second and 30 minutes at 100° C., respectively. The gas-blowing time was variously changed to produce elements. The IV characteristics thereof are shown in FIGS. 36A, 36B and 36C. FIGS. 36A, 36B and 36C show the results of the elements subjected to gas-blowing for 0 second, 10 seconds and 20 seconds, respectively. The element subjected to gas-blowing for 0 second was observed to have a marble pattern on the surface.

The element subjected to gas-blowing for 10 seconds was found to have favorable IV characteristics, and that for 20 seconds was found to have a conversion efficiency of 13%. When the gas was blown in a small amount, the resultant element was colored too slightly to confirm visually. However, if the blowing time is shortened, the conversion efficiency tends to be enhanced. If the annealing time was shortened to 10 minutes and 20 minutes, the efficiencies were found to be 12.3% and 12.4%, respectively. Those results suggest that the annealing time is preferably 30 minutes or more.

Example 10

The procedure of Example 9 was repeated except for preparing the perovskite precursor solution in the following manner. In a mixed solvent consisting of DMF and DMSO in a volume ratio of 4:1, 155 mg/l of formamidinium iodide (FAI), 458 mg/ml of lead iodide ($PbI_2$), 20 mg/ml of methylammonium bromide (MABr), 73 mg/l of lead bromide (PbBr), 19 mg/ml of cesium iodide (CsI) and 16 mg/ml of rubidium iodide (RbI) were dissolved.

Figure 37:
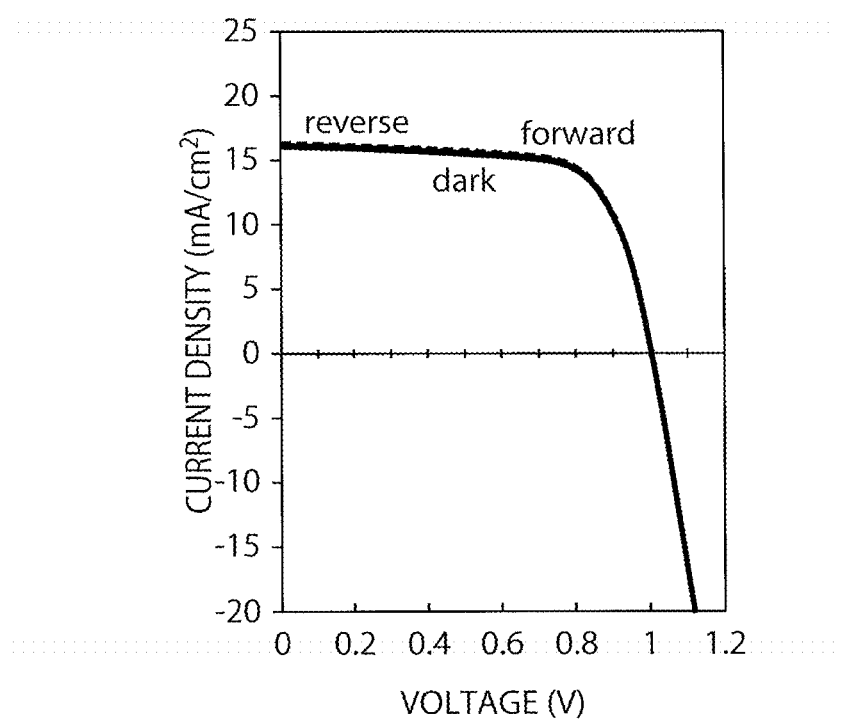
FIG. 37 shows I-V characteristics of the element in Example 10.

As shown in FIG. 37, the resultant element had conversion efficiencies of 11.3% and 11.5% and hardly exhibited hysteresis. If the gas-blowing procedure is omitted, the coating film of the perovskite precursor solution is directly exposed to the immersion fluid and hence the surface profile thereof is perturbed to form irregular patterns. In contrast, if the blowing procedure is carried out, the blown gas forms a thin dry layer on the surface of the film and consequently prevents formation of irregular patterns. However, if the blowing time is too long, the dry layer becomes so thick that the solvent contained in the film cannot be sufficiently removed and consequently it becomes difficult to form a perovskite structure.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and sprit of the invention.

The invention claimed is:

1. A semiconductor element comprising a first electrode, a second electrode, an active layer and a substrate; wherein said active layer comprises polycrystals oriented anisotropically, and said polycrystals have a perovskite structure.

2. The semiconductor element according to claim 1, wherein said polycrystals in said active layer are oriented anisotropically when viewed from an interface through which electrons or positive holes are transferred.

3. The semiconductor element according to claim 1, wherein said active layer shows X-ray diffraction intensities different between when an oblique X-ray is applied in a first direction to one point on the surface of said active layer and when said active layer surface is turned at 90° angle to the first direction so that the X-ray is applied in a second direction.

4. The semiconductor element according to claim 3, wherein said diffraction intensities are peak intensities corresponding to the (220) faces of said polycrystals.

5. The semiconductor element according to claim 3, wherein the ratio between said diffraction intensities given by the oblique X-rays in the first and second directions is 1.05 or more.

6. The semiconductor element according to claim 1, further comprising a first or second buffer layer between said active layer and said first electrode or said second electrode.

7. The semiconductor element according to claim 1, further comprising an undercoat layer.

8. A method for manufacturing a semiconductor element comprising a first electrode, a second electrode, an active layer and a substrate; wherein
said active layer is produced by the steps of
applying a coating solution comprising precursor compounds of said active layer and an organic solvent capable of dissolving said precursor compounds, to form a coating film; and then
blowing a gas onto said coating film,
wherein said active layer comprises polycrystals oriented anisotropically.

9. The method according to claim 8, wherein said coating film formed by application of said coating solution is blown with a laminar flow of said gas.

10. The method according to claim 8, wherein said coating film blown with said gas is then immersed in an immersion fluid.

11. The method according to claim 10, wherein said coating film immersed in said immersion fluid is thereafter annealed.

12. The method according to claim 8, wherein said active layer has a perovskite structure.

13. The method according to claim 8, wherein said organic solvent capable of dissolving said precursor compounds comprises DMSO.

14. A semiconductor element comprising a first electrode, a second electrode, an active layer, and a substrate; wherein said active layer comprises polycrystals oriented anisotropically and wherein said element further comprises a first or second buffer layer between said active layer and said first electrode or said second electrode.

15. The semiconductor element according to claim 14, wherein said polycrystals in said active layer are oriented anisotropically when viewed from an interface through which electrons or positive holes are transferred.

16. The semiconductor element according to claim 14, wherein said polycrystals have a perovskite structure.

17. The semiconductor element according to claim 14, wherein said active layer shows X-ray diffraction intensities different between when an oblique X-ray is applied in a first direction to one point on the surface of said active layer and when said active layer surface is turned at 90° angle to the first direction so that the X-ray is applied in a second direction.

18. The semiconductor element according to claim 17, wherein said diffraction intensities are peak intensities corresponding to the (220) faces of said polycrystals.

19. The semiconductor element according to claim 17, wherein the ratio between said diffraction intensities given by the oblique X-rays in the first and second directions is 1.05 or more.

20. The semiconductor element according to claim 14, further comprising an undercoat layer.

* * * * *